(12) United States Patent
Matsuzaki

(10) Patent No.: US 7,566,971 B2
(45) Date of Patent: Jul. 28, 2009

(54) SEMICONDUCTOR DEVICE AND MANUFACTURING METHOD THEREOF

(75) Inventor: Takanori Matsuzaki, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 406 days.

(21) Appl. No.: 11/417,187

(22) Filed: May 4, 2006

(65) Prior Publication Data

US 2006/0267202 A1    Nov. 30, 2006

(30) Foreign Application Priority Data

May 27, 2005    (JP)    ............... 2005-156443

(51) Int. Cl.
*H01L 29/40*    (2006.01)
*H01L 21/4763*    (2006.01)

(52) U.S. Cl. ............... 257/750; 257/758; 438/624; 438/626

(58) Field of Classification Search .......... 438/622, 438/624, 626, 637, 642, 652, 669, 672; 257/750, 257/758, 760
See application file for complete search history.

(56) References Cited

U.S. PATENT DOCUMENTS

| | | | |
|---|---|---|---|
| 5,519,578 A | 5/1996 | Fujii | |
| 5,639,989 A | 6/1997 | Higgins, III | |
| 5,677,515 A | 10/1997 | Selk et al. | |
| 5,937,322 A * | 8/1999 | Matsuura | 438/622 |
| 6,282,095 B1 * | 8/2001 | Houghton et al. | 361/704 |
| 6,396,144 B1 | 5/2002 | Koyama | |
| 6,847,273 B2 * | 1/2005 | Shin-Hsuan et al. | 333/204 |
| 6,903,459 B2 * | 6/2005 | Nakatani | 257/758 |
| 6,958,732 B2 | 10/2005 | Yuanzhu | |
| 6,982,227 B2 * | 1/2006 | Cooney et al. | 438/706 |
| 7,030,455 B2 | 4/2006 | Gamand et al. | |
| 2003/0127728 A1 * | 7/2003 | Audet et al. | 257/713 |
| 2005/0140495 A1 | 6/2005 | Yamazaki et al. | |
| 2005/0148121 A1 | 7/2005 | Yamazaki et al. | |

(Continued)

FOREIGN PATENT DOCUMENTS

CN    1341964    3/2002

(Continued)

OTHER PUBLICATIONS

"Office Action (Application No. 200610087838.4) Dated Feb. 20, 2009".

*Primary Examiner*—Kevin M Picardat
(74) *Attorney, Agent, or Firm*—Eric J. Robinson; Robinson Intellectual Property Law Office, P.C.

(57) ABSTRACT

The invention provides a technology for manufacturing a higher performance and higher reliability semiconductor device at low cost and with high yield. The semiconductor device of the invention has a first conductive layer over a first insulating layer; a second insulating layer over the first conductive layer, which includes an opening extending to the first conductive layer; and a signal wiring layer for electrically connecting an integrated circuit portion to an antenna and a second conductive layer adjacent to the signal wiring layer, which are formed over the second insulating layer. The second conductive layer is in contact with the first conductive layer through the opening, and the first conductive layer overlaps the signal wiring layer with the second insulating layer interposed therebetween.

40 Claims, 16 Drawing Sheets

| U.S. PATENT DOCUMENTS | | | |
|---|---|---|---|
| 2007/0108521 A1 | 5/2007 | Dekker | |
| 2007/0187824 A1* | 8/2007 | Anzai | 257/737 |

FOREIGN PATENT DOCUMENTS

| EP | 1187206 | 3/2002 |
|---|---|---|
| EP | 1494167 | 1/2005 |
| JP | 05-22001 | 1/1993 |
| JP | 2000-90222 | 3/2000 |
| WO | WO-2005/004049 | 1/2005 |

* cited by examiner

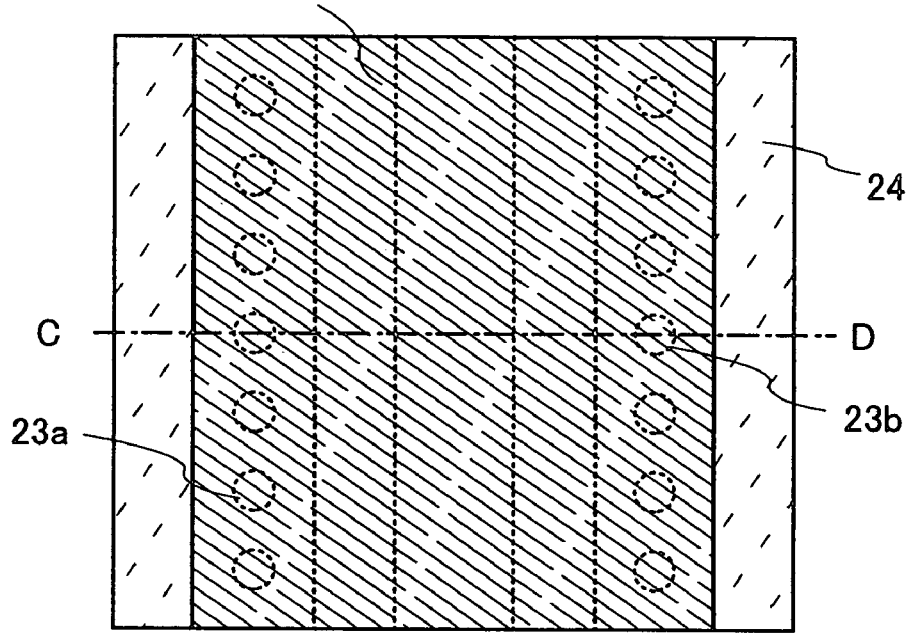
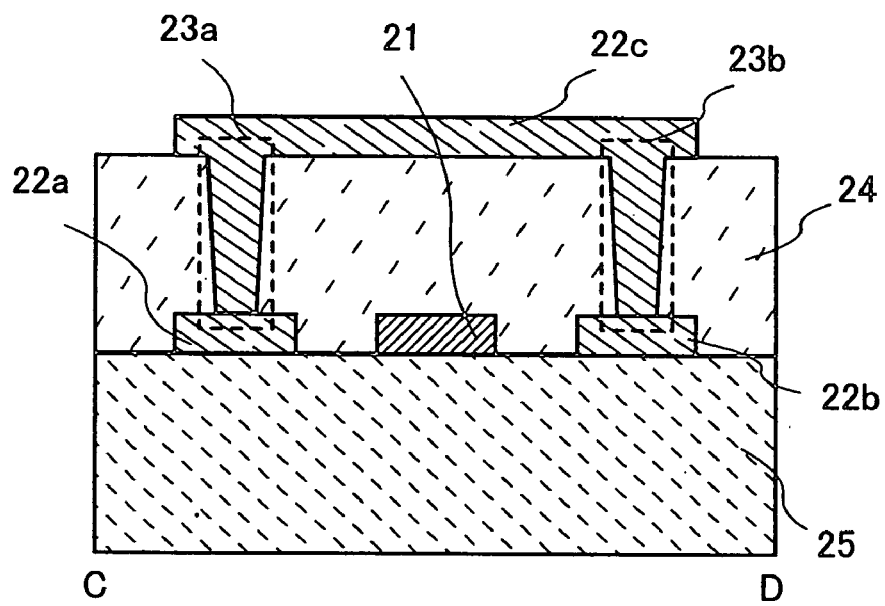

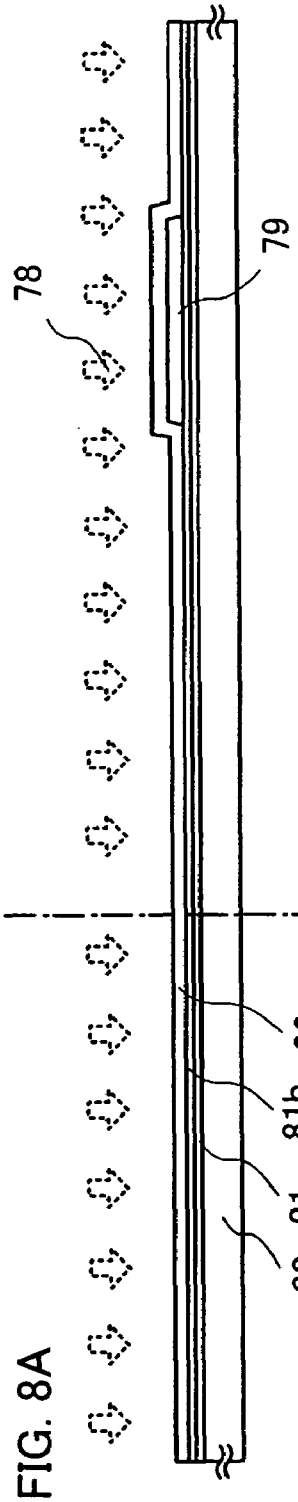
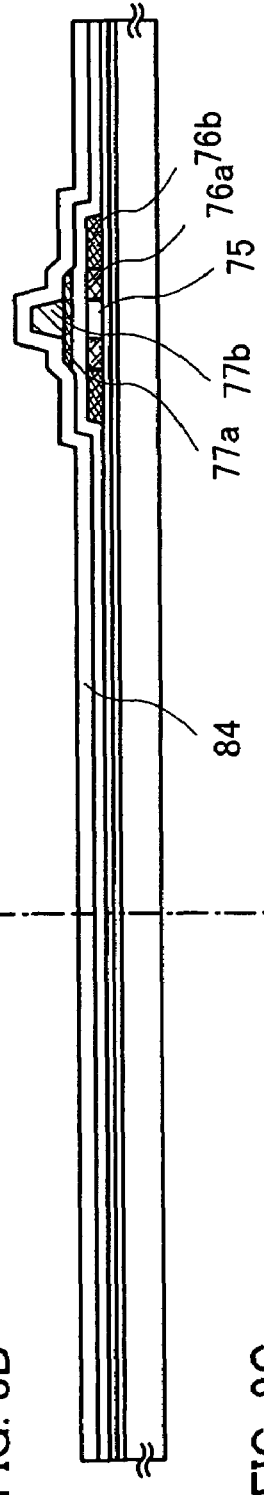
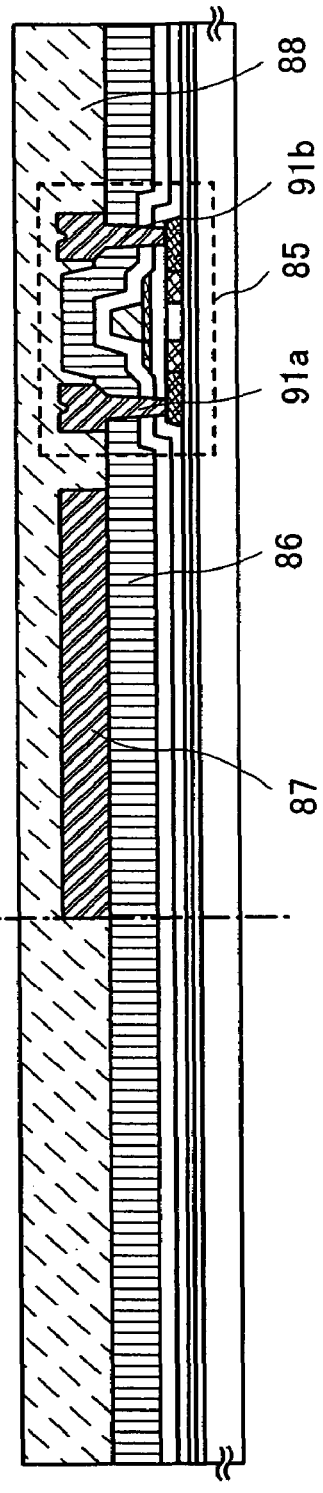

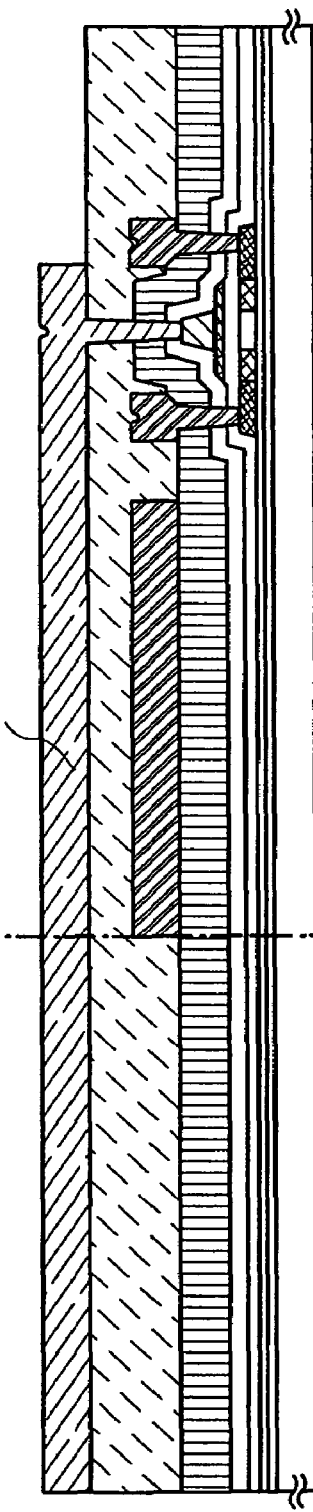
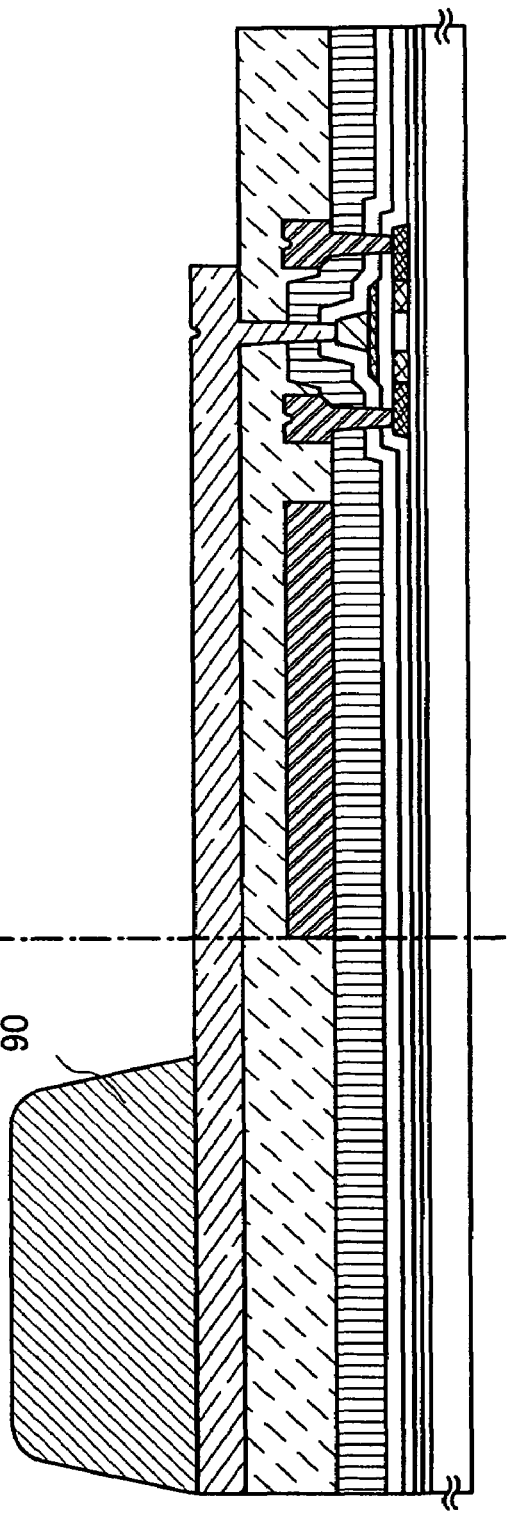
FIG. 9A
FIG. 9B

| Double GateTFT510 | Single gateTFT520 | Capacitor 530 | Wiring 540 |

SEMICONDUCTOR DEVICE AND MANUFACTURING METHOD THEREOF

BACKGROUND OF THE INVENTION

1. Field of the Invention

The present invention relates to a semiconductor device and a manufacturing method of the same.

2. Description of the Related Art

In recent years, identification technology where an ID (identification number) is assigned to each object so as to reveal data thereon such as the history has been attracting attention, which is utilized for production management and the like. Above all, semiconductor devices capable of communicating data without contact have been developed. Such semiconductor devices include an RFID (Radio Frequency Identification) tag (also called an ID tag, an IC tag, an IC chip, an RF (Radio Frequency) tag, a wireless tag, an electronic tag, or a wireless chip), and the like have been introduced into companies, markets and the like.

Most of these semiconductor devices are constituted by an antenna and an integrated circuit. For example, an information storage component is mounted as an integrated circuit on a module substrate, and electrically connected to an antenna (see Patent Document 1).

[Patent Document 1] Japanese Patent Laid-Open No. 2000-90222

If signals are communicated between an integrated circuit and an antenna through a signal line, enough propagation characteristics cannot be obtained depending on the frequency, which results in transmission losses. In addition, electromagnetic shielding properties of the signal line are not enough, leading to electrical failure such as interference with signal wires of the integrated circuit.

SUMMARY OF THE INVENTION

In view of the forgoing, the invention provides a semiconductor device with high performance and high reliability, which is capable of reducing losses due to propagation characteristics of signals between an integrated circuit and an antenna.

A semiconductor device of the invention has a first conductive layer over a first insulating layer; a second insulating layer over the first conductive layer, which includes an opening extending to the first conductive layer; and a signal wiring layer for electrically connecting an integrated circuit portion to an antenna and a second conductive layer adjacent to the signal wiring layer, which are formed over the second insulating layer. The second conductive layer is in contact with the first conductive layer through the opening, and the first conductive layer overlaps the signal wiring layer with the second insulating layer interposed therebetween.

A semiconductor device of the invention has a first conductive layer over a first insulating layer; a second insulating layer over the first conductive layer, which includes a first opening and a second opening each extending to the first conductive layer; and a signal wiring layer for electrically connecting an integrated circuit portion to an antenna and a second conductive layer and a third conductive layer adjacent to each other with the signal wiring layer interposed therebetween, which are formed over the second insulating layer. The first conductive layer is in contact with the second conductive layer and the third conductive layer through the first opening and the second opening respectively.

A semiconductor device of the invention has a signal wiring layer for electrically connecting an integrated circuit portion to an antenna and a first conductive layer adjacent to the signal wiring layer, which are formed over a first insulating layer; a second insulating layer over the signal wiring layer and the first conductive layer, which includes an opening extending to the first conductive layer; and a second conductive layer over the second insulating layer. The second conductive layer is in contact with the first conductive layer through the opening, and the second conductive layer overlaps the signal wiring layer with the second insulating layer interposed therebetween.

A semiconductor device of the invention has a signal wiring layer for electrically connecting an integrated circuit portion to an antenna and a first conductive layer and a second conductive layer adjacent to each other with the signal wiring layer interposed therebetween, which are formed over a first insulating layer; a second insulating layer over the signal wiring layer, the first conductive layer, and the second conductive layer, which includes a first opening extending to the first conductive layer and a second opening extending to the second conductive layer; and a third conductive layer over the second insulating layer. The third conductive layer is in contact with the first conductive layer and the second conductive layer through the first opening and the second opening respectively.

A semiconductor device of the invention has a first conductive layer over a first insulating layer; a second insulating layer over the first conductive layer, which includes a first opening and a second opening; a signal wiring layer for electrically connecting an integrated circuit portion to an antenna and a second conductive layer and a third conductive layer adjacent to each other with the signal wiring layer interposed therebetween, which are formed over the second insulating layer; a third insulating layer over the signal wiring layer, the second conductive layer, and the third conductive layer, which includes a third opening extending to the second conductive layer and a fourth opening extending to the third conductive layer; and a fourth conductive layer over the third insulating layer. The first conductive layer is in contact with the second conductive layer and the third conductive layer through the first opening and the second opening respectively, and the fourth conductive layer is in contact with the second conductive layer and the third conductive layer through the third opening and the fourth opening respectively.

A manufacturing method of a semiconductor device of the invention has the steps of forming a first conductive layer over a first insulating layer; forming a second insulating layer over the first conductive layer, which includes an opening extending to the first conductive layer; forming a conductive film over the second insulating layer; and processing the conductive film, thereby forming a signal wiring layer that overlaps the first conductive layer with the second insulating layer interposed therebetween and electrically connects an integrated circuit portion to an antenna, and a second conductive layer that is adjacent to the signal wiring layer and in contact with the first conductive layer through the opening.

A manufacturing method of a semiconductor device of the invention has the steps of forming a first conductive layer over a first insulating layer; forming a second insulating layer over the first conductive layer, which includes a first opening and a second opening each extending to the first conductive layer; forming a conductive film over the second insulating layer; and processing the conductive film, thereby forming a signal wiring layer that overlaps the first conductive layer with the second insulating layer interposed therebetween and electrically connects an integrated circuit portion to an antenna, and a second conductive layer that is adjacent to the signal wiring layer and in contact with the first conductive layer through the first opening and the second opening.

A manufacturing method of a semiconductor device of the invention has the steps of forming a conductive film over a first insulating layer; processing the conductive film, thereby forming a signal wiring layer for electrically connecting an integrated circuit portion to an antenna and a first conductive layer adjacent to the signal wiring layer; forming a second insulating layer over the signal wiring layer and the first conductive layer, which includes an opening extending to the first conductive layer; and forming a second conductive layer over the second insulating layer, which is in contact with to the first conductive layer through the opening.

A manufacturing method of a semiconductor device of the invention has the steps of forming a conductive film over a first insulating layer; processing the conductive film, thereby forming a signal wiring layer for electrically connecting an integrated circuit portion to an antenna and a first conductive layer and a second conductive layer adjacent to each other with the signal wiring layer interposed therebetween; forming a second insulating layer over the signal wiring layer, the first conductive layer, and the second conductive layer, which includes a first opening extending to the first conductive layer and a second opening extending to the second conductive layer; and forming a third conductive layer over the second insulating layer, which is in contact with the first conductive layer and the second conductive layer through the first opening and the second opening respectively.

A manufacturing method of a semiconductor device of the invention has the steps of forming a first conductive layer over a first insulating layer; forming a second insulating layer over the first conductive layer, which includes a first opening and a second opening; forming a conductive film over the second insulating layer; processing the conductive film, thereby forming a signal wiring layer for electrically connecting an integrated circuit portion to an antenna, and a second conductive layer and a third conductive layer that are adjacent to each other with the signal wiring layer interposed therebetween and connected to the first conductive layer through the first opening and the second opening respectively; forming a third insulating layer over the signal wiring layer, the second conductive layer, and the third conductive layer, which includes a third opening extending to the second conductive layer and a fourth opening extending to the third conductive layer; and forming a fourth conductive layer over the third insulating layer, which is in contact with the second conductive layer and the third conductive layer through the third opening and the fourth opening respectively.

In the semiconductor device of the invention, the integrated circuit portion may include a thin film transistor or a memory element. The integrated circuit portion, the signal wiring layer, and the antenna may be formed over a flexible substrate. Alternatively, the integrated circuit, the signal wiring layer, and the antenna may be formed over a glass substrate and then separated from the glass substrate to be transferred onto a flexible substrate.

According to the invention, a conductive layer is provided to surround a signal wiring layer; therefore, the propagation characteristics of a signal received from or transmitted to an antenna can be improved. Further, excellent electromagnetic shielding properties can prevent an integrated circuit from interfering with signal wires. Accordingly, a semiconductor device with high performance and high reliability can be provided.

BRIEF DESCRIPTION OF DRAWINGS

FIGS. 2A and 2B are diagrams each showing a semiconductor device described in Embodiment Mode 2 of the invention.

FIGS. 8A to 8C are diagrams each showing a manufacturing method of a semiconductor device, which is described in Embodiment 2 of the invention.

FIGS. 9A and 9B are diagrams each showing the manufacturing method of a semiconductor device, which is described in Embodiment 2 of the invention.

DETAILED DESCRIPTION OF THE INVENTION

Figure 1A:
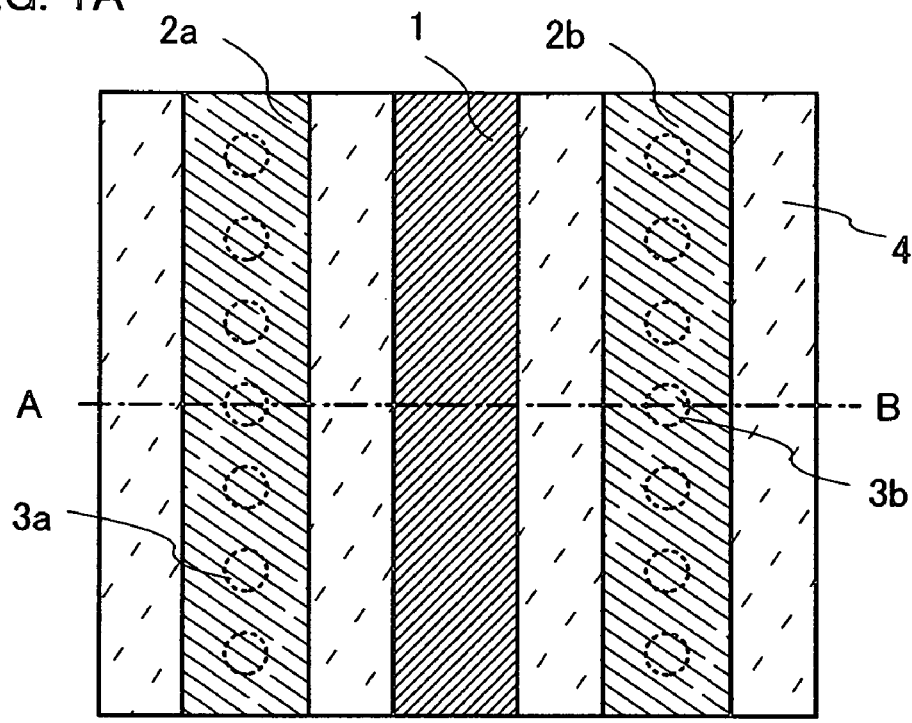
FIGS. 1A and 1B are diagrams each showing a semiconductor device described in Embodiment Mode 1 of the invention.

Although the invention will be described by way of embodiment modes and embodiments with reference to the accompanying drawings, it is to be understood that various changes and modifications will be apparent to those skilled in the art. Therefore, unless such changes and modifications depart from the scope of the invention, they should be construed as being included therein. Note that in all the drawings for illustrating the embodiment modes and the embodiments, the identical portions or portions having similar function are denoted by the same reference numerals, and description thereon is not repeated.

EMBODIMENT MODE 1

In this embodiment mode, an example of a semiconductor device of the invention is described with reference to FIGS. 1A and 1B.

Figure 1B:
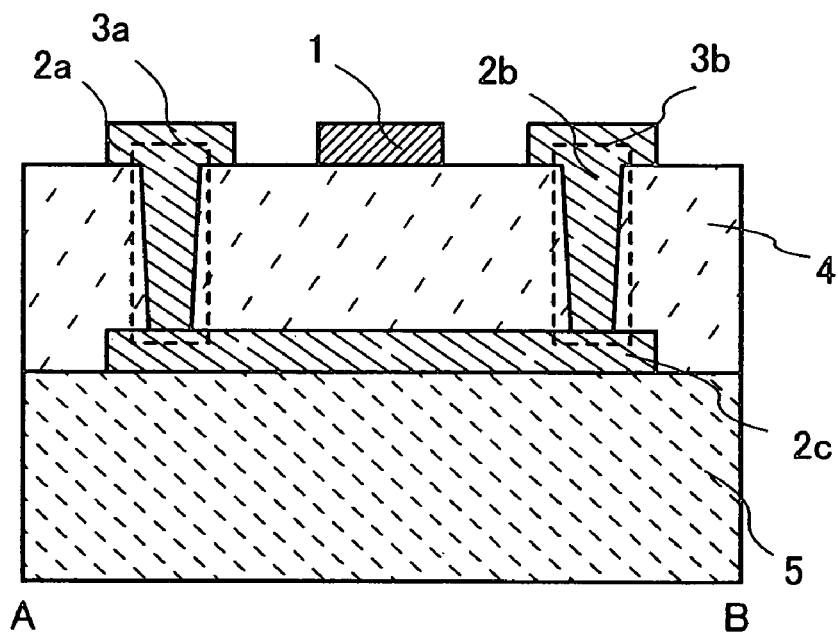

FIG. 1A is a top view of a semiconductor device of this embodiment mode, and FIG. 1B is a cross sectional view along a line A-B. The semiconductor device of this embodiment mode has a signal wiring layer 1 for a signal received from or transmitted to an antenna, a conductive layer 2a, a conductive layer 2b, a conductive layer 2c, an insulating layer 4 including an opening 3a and an opening 3b, and an insulating layer 5. The conductive layer 2a, the conductive layer 2b, and the conductive layer 2c are referenced to a signal (e.g., radio frequency signal) received from or transmitted to the signal wiring layer, and are set to an arbitrary potential. The conductive layer 2a and the conductive layer 2b are connected to the conductive layer 2c with a plurality of vias (the opening 3a and the opening 3b) along the propagation direction of a signal.

The conductive layer 2a, the conductive layer 2b, and the signal wiring layer 1 may be formed in different steps, or may be formed in the same step using the same material. In the latter case, it is preferable that a conductive film be formed over the insulating layer 4 including the opening 3a and the opening 3b, and the conductive film be processed by etching or the like to form the conductive layer 2a, the conductive layer 2b, and the signal wiring layer 1.

The two conductive layers 2a and 2b are provided in parallel to the signal wiring layer 1 so as to sandwich the signal wiring layer 1 therebetween. The conductive layer 2c is provided below in the thickness direction of the signal wiring layer 1. The conductive layer 2c is connected to the conductive layer 2a and the conductive layer 2b at the right and left of the signal wiring layer 1 through the opening 3a and the opening 3b that are the vias. The conductive layer 2a, the conductive layer 2b, and the conductive layer 2c have a function of blocking electrical signals transmitted from the signal wiring layer 1. Accordingly, when the conductive layer 2a, the conductive layer 2b, and the conductive layer 2c are provided below and at the right and left in the thickness direction of the signal wiring layer 1, electromagnetic shielding properties are improved and excellent propagation characteristics of a signal received from or transmitted to an antenna can be obtained. Thus, transmission losses can be reduced even when using a radio frequency signal.

According to the invention, the conductive layers are provided so as to surround the signal wiring layer, thereby the propagation characteristics of a signal received from or transmitted to an antenna can be improved. Further, excellent electromagnetic shielding properties can prevent an integrated circuit from interfering with signal wires. Accordingly, a semiconductor device with high performance and high reliability can be provided.

EMBODIMENT MODE 2

In this embodiment mode, an example of a semiconductor device of the invention is described with reference to FIGS. 2A and 2B.

FIG. 2A is a top view of a semiconductor device of this embodiment mode, and FIG. 2B is a cross sectional view along a line C-D. The semiconductor device of this embodiment mode has a signal wiring layer 21 for a signal received from or transmitted to an antenna, a conductive layer 22a, a conductive layer 22b, a conductive layer 22c, an insulating layer 24 including an opening 23a and an opening 23b, and an insulating layer 25. The conductive layer 22a, the conductive layer 22b, and the conductive layer 22c are referenced to a signal (e.g., radio frequency signal) received from or transmitted to the signal wiring layer, and are set to an arbitrary potential. The conductive layer 22a and the conductive layer 22b are connected to the conductive layer 22c with a plurality of vias (the opening 23a and the opening 23b) along the propagation direction of a signal.

The conductive layer 22a, the conductive layer 22b, and the signal wiring layer 21 may be formed in different steps, or may be formed in the same step using the same material. In the latter case, it is preferable that a conductive film be formed over the insulating layer 25, and the conductive film be processed by etching or the like to form the conductive layer 22a, the conductive layer 22b, and the signal wiring layer 21.

The two conductive layers 22a and 22b are provided in parallel to the signal wiring layer 21 so as to sandwich the signal wiring layer 21 therebetween. The conductive layer 22c is provided above in the thickness direction of the signal wiring layer 21. The conductive layer 22c is connected to the conductive layer 22a and the conductive layer 22b at the right and left of the signal wiring layer 21 through the opening 23a and the opening 23b that are the vias. The conductive layer 22a, the conductive layer 22b, and the conductive layer 22c have a function of blocking electrical signals transmitted from the signal wiring layer 21. Accordingly, when the conductive layer 22a, the conductive layer 22b, and the conductive layer 22c are provided above and at the right and left in the thickness direction of the signal wiring layer 21, electromagnetic shielding properties are improved and excellent propagation characteristics of a signal received from or transmitted to an antenna can be obtained. Thus, transmission losses can be reduced even when using a radio frequency signal.

According to the invention, the conductive layers are provided so as to surround the signal wiring layer, thereby the propagation characteristics of a signal received from or transmitted to an antenna can be improved. Further, excellent electromagnetic shielding properties can prevent an integrated circuit from interfering with signal wires. Accordingly, a semiconductor device with high performance and high reliability can be provided.

EMBODIMENT MODE 3

In this embodiment mode, an example of a semiconductor device of the invention is described with reference to FIGS. 3A and 3B.

Figure 3A:
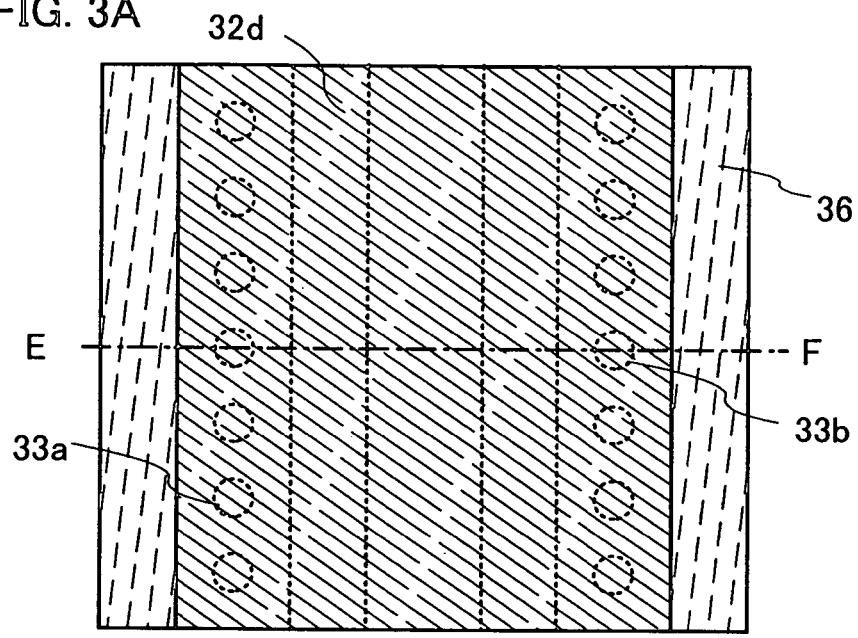
FIGS. 3A and 3B are diagrams each showing a semiconductor device described in Embodiment Mode 3 of the invention.
Figure 3B:
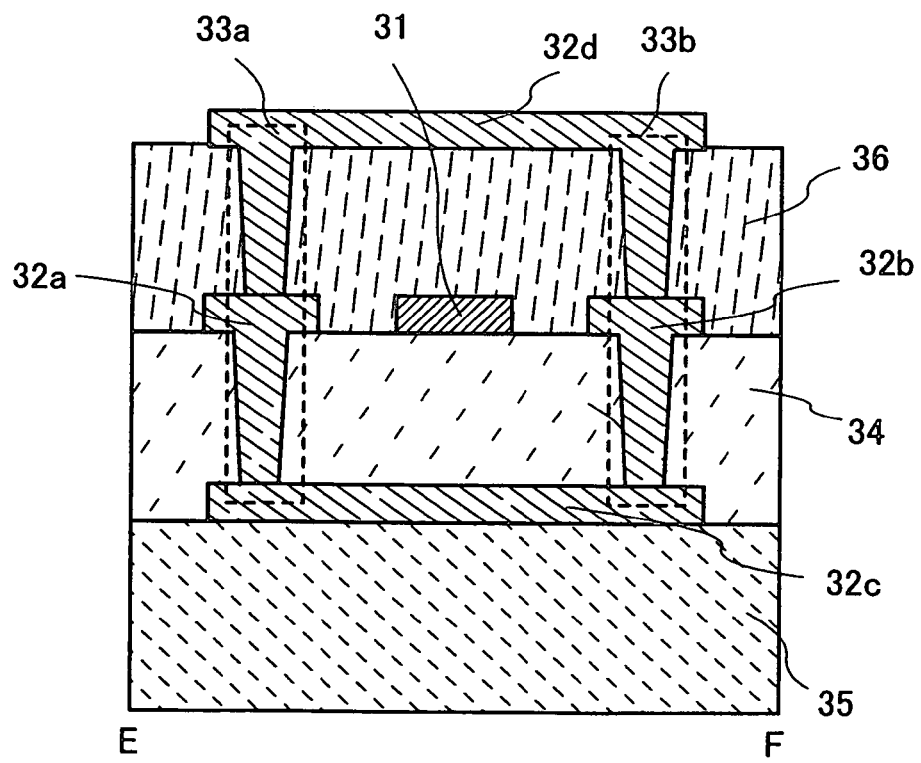

FIG. 3A is a top view of a semiconductor device of this embodiment mode, and FIG. 3B is a cross sectional view along a line E-F. The semiconductor device of this embodiment mode has a signal wiring layer 31 for a signal received from or transmitted to an antenna, a conductive layer 32a, a conductive layer 32b, a conductive layer 32c, a conductive layer 32d, an insulating layer 34 and an insulating layer 36 each including an opening 33a and an opening 33b, and an insulating layer 35. The conductive layer 32a, the conductive layer 32b, the conductive layer 32c, and the conductive layer 32d are referenced to a signal (e.g., radio frequency signal) received from or transmitted to the signal wiring layer, and are set to an arbitrary potential. The conductive layer 32a and the conductive layer 32b are connected to the conductive layer 32c and the conductive layer 32d with a plurality of vias (the opening 33a and the opening 33b) along the propagation direction of a signal.

The conductive layer 32a, the conductive layer 32b, and the signal wiring layer 31 may be formed in different steps, or may be formed in the same step using the same material. In the latter case, it is preferable that a conductive film be formed over the insulating layer 34 including the opening 33a and the opening 33b each extending to the conductive layer 32c, and the conductive film be processed by etching or the like to form the conductive layer 32a, the conductive layer 32b, and the signal wiring layer 31.

The two conductive layers 32a and 32b are provided in parallel to the signal wiring layer 31 so as to sandwich the signal wiring layer 31 therebetween. The conductive layer 32d and the conductive layer 32c are provided above and below in the thickness direction of the signal wiring layer 31, respectively. The conductive layer 32c and the conductive layer 32d are connected to the conductive layer 32a and the conductive layer 32b at the right and left of the signal wiring layer 31 through the opening 33a and the opening 33b. The conductive layer 32a, the conductive layer 32b, the conductive layer 32c, and the conductive layer 32d have a function of blocking electrical signals transmitted from the signal wiring layer 31. Accordingly, when the conductive layer 32a, the conductive layer 32b, the conductive layer 32c, and the conductive layer 32d are provided above and below and at the right and left in the thickness direction of the signal wiring layer 31, electromagnetic shielding properties are improved and excellent propagation characteristics of a signal received from or transmitted to an antenna can be obtained. Thus, transmission losses can be reduced even when using a radio frequency signal.

According to the invention, the conductive layers are provided so as to surround the signal wiring layer, thereby the propagation characteristics of a signal received from or transmitted to an antenna can be improved. Further, excellent electromagnetic shielding properties can prevent an integrated circuit from interfering with signal wires. Accordingly, a semiconductor device with high performance and high reliability can be provided.

EMBODIMENT MODE 4

In this embodiment mode, an example of a semiconductor device of the invention is described with reference to FIGS. 4A and 4B.

Figure 4A:
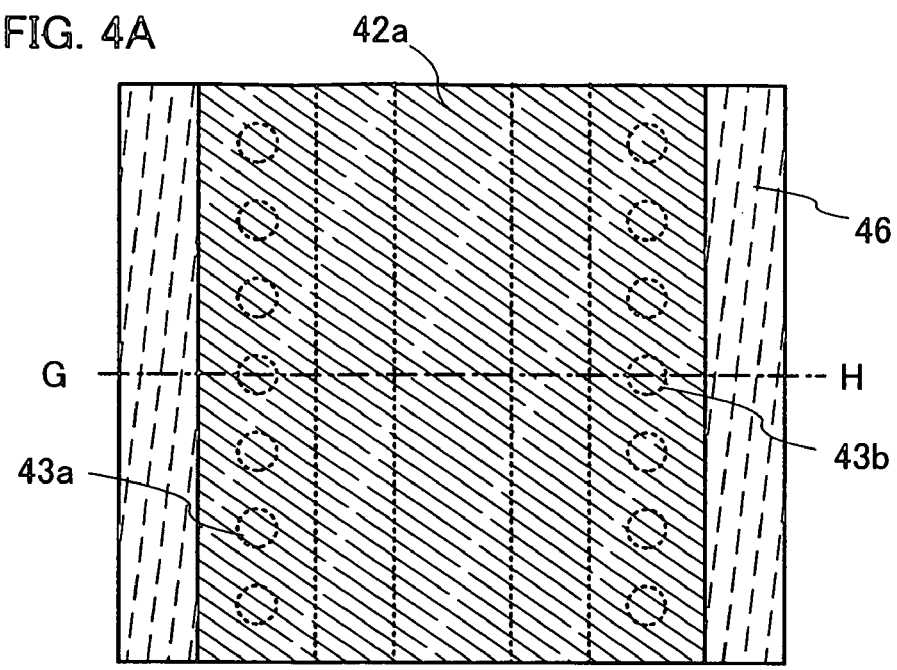
FIGS. 4A and 4B are diagrams each showing a semiconductor device described in Embodiment Mode 4 of the invention.
Figure 4B:
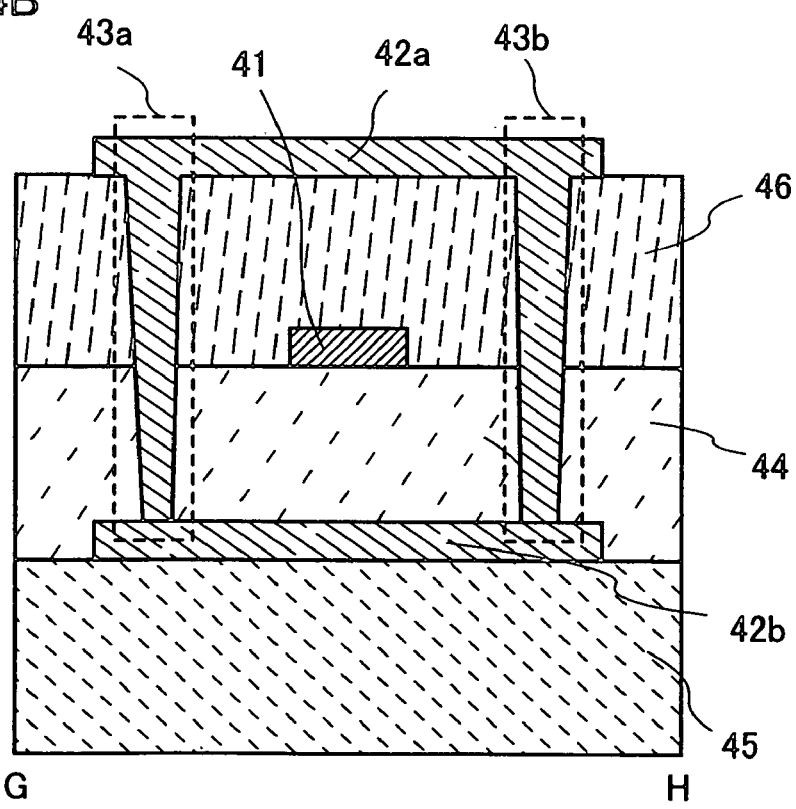

FIG. 4A is a top view of a semiconductor device of this embodiment mode, and FIG. 4B is a cross sectional view along a line G-H. The semiconductor device of this embodiment mode has a signal wiring layer 41 for a signal received from or transmitted to an antenna, a conductive layer 42a, a conductive layer 42b, an insulating layer 44 and an insulating layer 46 each including an opening 43a and an opening 43b, and an insulating layer 45. The conductive layer 42a and the conductive layer 42b are referenced to a signal (e.g., radio frequency signal) received from or transmitted to the signal wiring layer, and are set to an arbitrary potential. The conductive layer 42a and the conductive layer 42b are connected to each other with a plurality of vias (the opening 43a and the opening 43b) along the propagation direction of a signal.

The opening 43a and the opening 43b may be formed in the stacked insulating layer 44 and insulating layer 46 in one etching step or a plurality of etching steps.

The conductive layer 42a and the conductive layer 42b are provided above and below in the thickness direction of the signal wiring layer 41 respectively so as to sandwich the signal wiring layer 41 therebetween. The conductive layer 42a over the insulating layer 46 is connected to the conductive layer 42b below the insulating layer 44 through the opening 43a and the opening 43b. The conductive layer 42a and the conductive layer 42b have a function of blocking electrical signals transmitted from the signal wiring layer 41. In addition, the conductive layer 42a and the conductive layer 42b are connected to each other through the plurality of openings and formed in the insulating layer 46 and the insulating layer 44. Accordingly, the conductive layers having a function of blocking and reflecting signals transmitted from the signal wiring layer 41 are also provided at the right and left of the signal wiring layer 41. As a result, electromagnetic shielding properties are particularly improved in the thickness direction of the signal wiring layer 41 and the direction perpendicular to the thickness direction, and excellent propagation characteristics of a signal received from or transmitted to an antenna can be obtained. Thus, transmission losses can be reduced even when using a radio frequency signal.

According to the invention, the conductive layers are provided so as to surround the signal wiring layer, thereby the propagation characteristics of a signal received from or transmitted to an antenna can be improved. Further, excellent electromagnetic shielding properties can prevent an integrated circuit from interfering with signal wires. Accordingly, a semiconductor device with high performance and high reliability can be provided.

EMBODIMENT MODE 5

In this embodiment mode, an example of a semiconductor device of the invention is described with reference to FIGS. 5A and 5B.

Figure 5A:
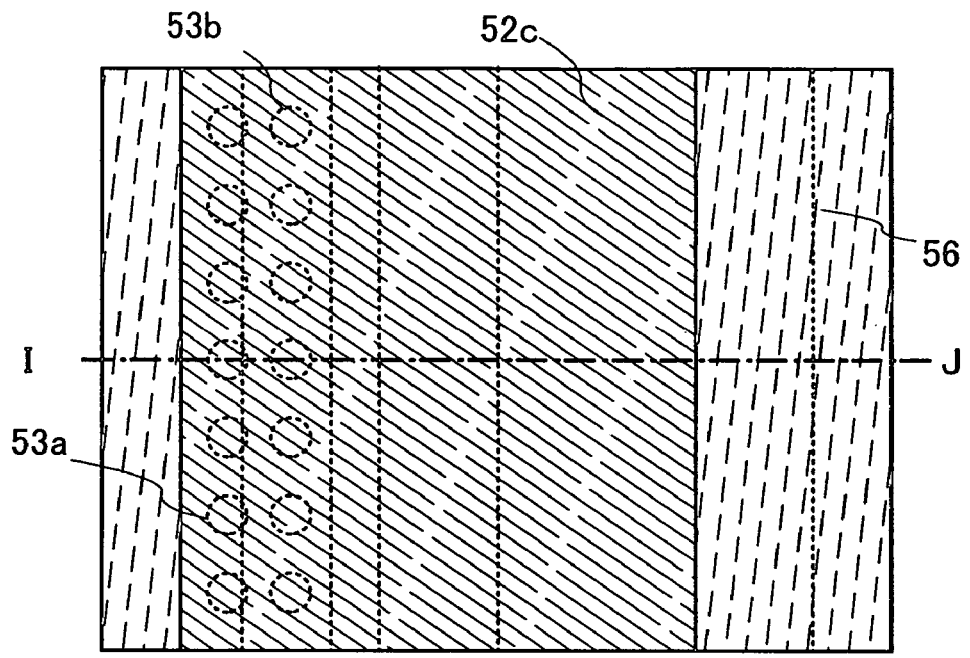
FIGS. 5A and 5B are diagrams each showing a semiconductor device described in Embodiment Mode 5 of the invention.
Figure 5B:
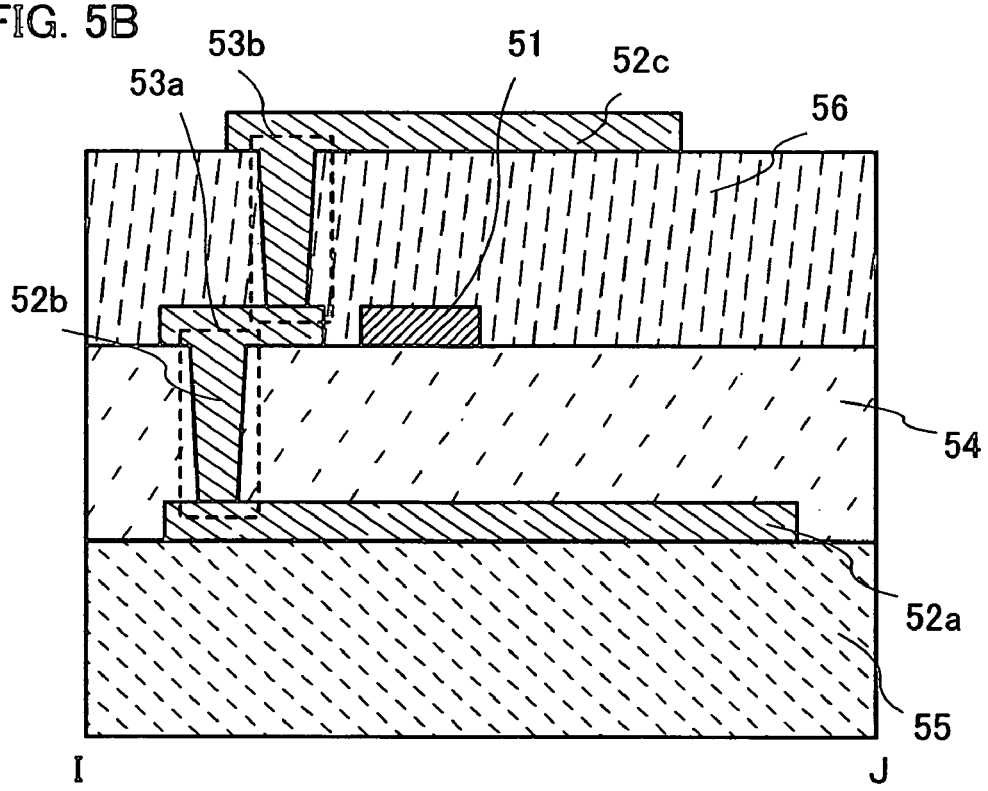

FIG. 5A is a top view of a semiconductor device of this embodiment mode, and FIG. 5B is a cross sectional view along a line I-J. The semiconductor device of this embodiment mode has a signal wiring layer 51 for a signal received from or transmitted to an antenna, a conductive layer 52a, a conductive layer 52b, a conductive layer 52c, an insulating layer 54 including an opening 53a, an insulating layer 56 including an opening 53b, and an insulating layer 55. The conductive layer 52a, the conductive layer 52b, and the conductive layer 52c are referenced to a signal (e.g., radio frequency signal) received from or transmitted to the signal wiring layer, and are set to an arbitrary potential. The conductive layer 52a, the conductive layer 52b, and the conductive layer 52c are connected to each other with a plurality of vias (the opening 53a and the opening 53b) along the propagation direction of a signal.

The conductive layer 52b is provided in parallel to the signal wiring layer 51. The conductive layer 52c is provided above in the thickness direction of the insulating layer 56, and the conductive layer 52a is provided below in the thickness direction of the insulating layer 54. The conductive layer 52a, the conductive layer 52b, and the conductive layer 52c are connected to each other through the opening 53a and the opening 53b. As shown here, the conductive layers provided to surround the signal wiring layer are not necessarily symmetric, and may be different from each other as the conductive layer 52a, the conductive layer 52b, and the conductive layer 52c. In addition, the openings for connecting the conductive layers may be displaced from each other as the opening 53a and the opening 53b. The shape and the number of the conductive layers may be determined so as to satisfy the purpose and required performance of the semiconductor device. The conductive layer 52a, the conductive layer 52b, and the conductive layer 52c have a function of blocking electrical signals transmitted from the signal wiring layer 51. Accordingly, in this embodiment mode, electromagnetic shielding properties are improved in the thickness direction of the signal wiring layer 51 and the direction of the conductive layer 52b, and excellent propagation characteristics of a signal received from or transmitted to an antenna can be obtained. Thus, transmission losses can be reduced even when using a radio frequency signal.

According to the invention, the conductive layers are provided so as to surround the signal wiring layer, thereby the propagation characteristics of a signal received from or transmitted to an antenna can be improved. Further, excellent electromagnetic shielding properties can prevent an integrated circuit from interfering with signal wires. Accordingly, a semiconductor device with high performance and high reliability can be provided.

EMBODIMENT 1

In this embodiment, an example of a semiconductor device of the invention is described with reference to FIG. 6.

Figure 6:
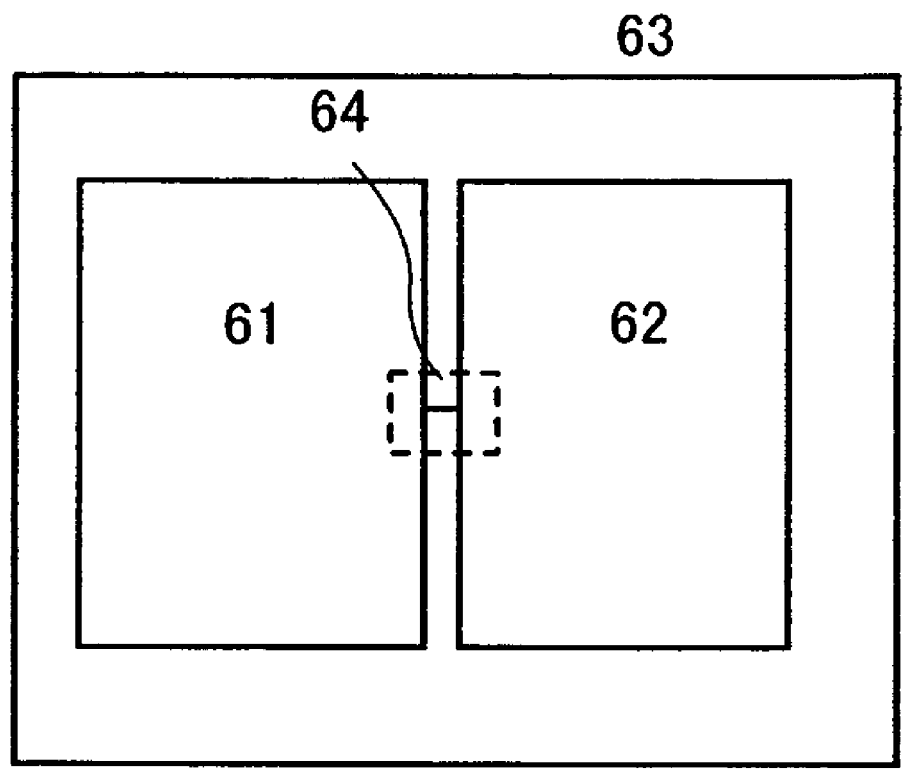
FIG. 6 is a configuration diagram of a semiconductor device described in Embodiment 1 of the invention.

FIG. 6 is a configuration diagram of an RFID 63 that is a semiconductor device of this embodiment. The RFID 63 includes an antenna 61 and an integrated circuit 62 that are electrically connected to each other with a signal wiring layer.

Figure 7A:
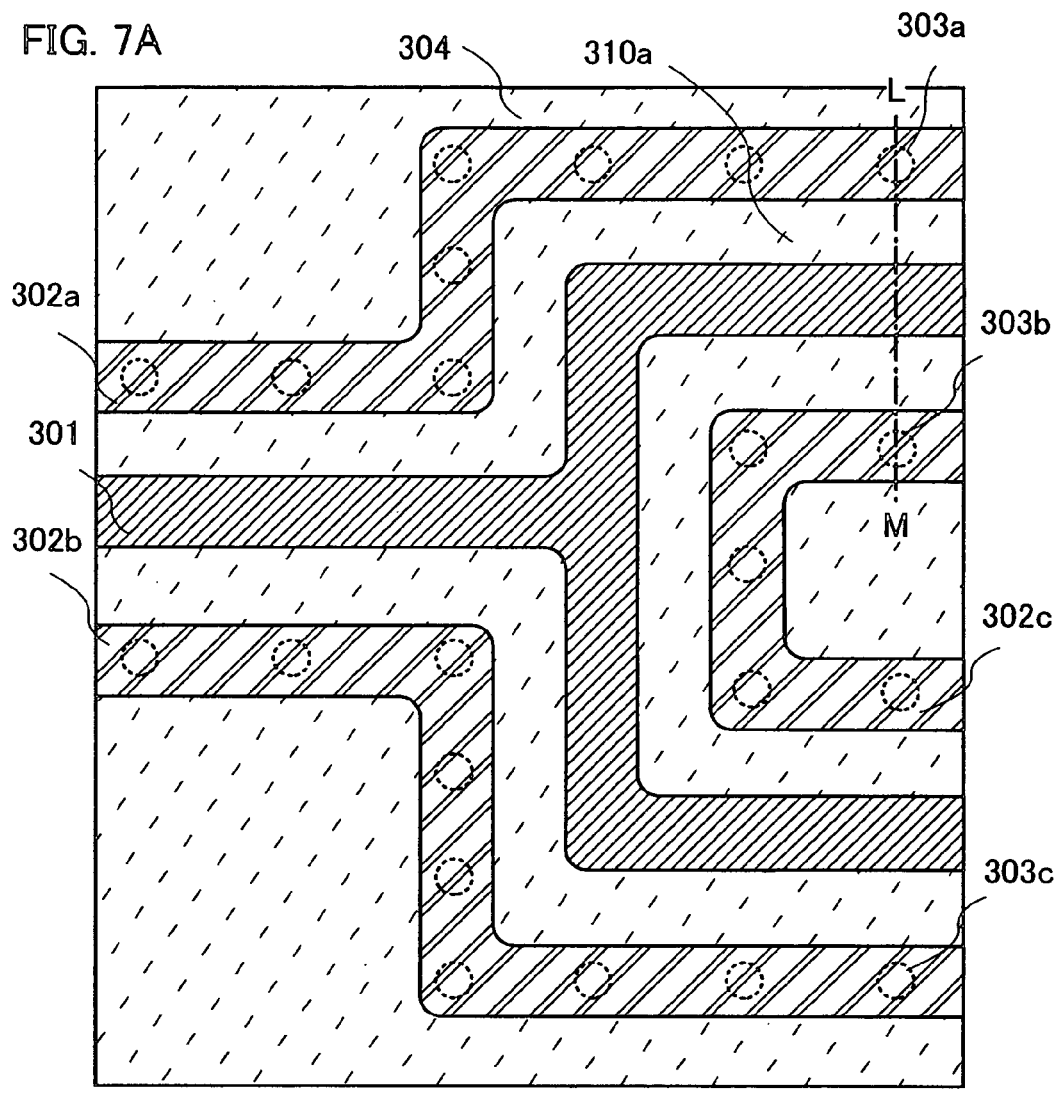
FIGS. 7A and 7B are respectively a top view and a cross sectional view of the semiconductor device described in Embodiment 1 of the invention.
Figure 7B:
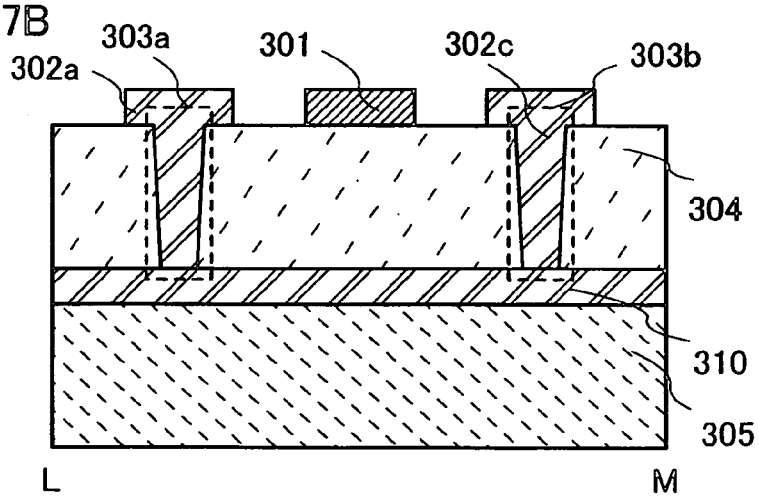

FIGS. 7A and 7B are enlarged views of a region 64 shown in FIG. 6. FIG. 7A is a top view of the region 64, and FIG. 7B is a cross sectional view along a line LM of FIG. 7A. FIGS. 7A and 7B show a signal wiring layer 301 for a signal received from or transmitted to an antenna, a conductive layer 302a, a conductive layer 302b, a conductive layer 302c, an insulating layer 304 including an opening 303a, an opening 303b, and an opening 303c, and an insulating layer 305. A conductive layer 310 is formed under the insulating layer 304, and the opening 303a and the opening 303b are formed in the insulating layer 304 and extend to the conductive layer 310. The conductive layer 310 is electrically connected to the conductive layer 302a and the conductive layer 302c through the opening 303a and the opening 303b respectively.

The conductive layer 302a and the conductive layer 302b are provided at the right and left of the signal wiring layer 301. Even after the signal wiring layer 301 branches into two directions, the conductive layer 302a, the conductive layer 302b, and the conductive layer 302c are provided at the right and left, which has an effect of improving electromagnetic shielding properties and reducing crosstalk.

As shown in the top view of FIG. 7A, the wiring layer has a pattern where a corner that is a right triangle in each edge bent into an L shape is removed so that one side of the triangle is 10 μm or shorter, or equal to or longer than one-fifth the width of the wiring layer and equal to or shorter than half the width of the wiring layer, thereby the edge is rounded. That is to say, the circumference of the wiring layer in the edge is curved when seen from above. Specifically, in order to form a round circumference of the edge, a part of the wiring layer is removed, which corresponds to an isosceles right triangle having two first straight lines that are perpendicular to each other making the edge, and a second straight line that makes an angle of about 45 degrees with the two first straight lines. When removing the triangle, two obtuse angles are formed in the wiring layer. At this time, the wiring layer is preferably etched by appropriately adjusting the etching conditions and/or a mask design so that a curved line in contact with the first straight line and the second straight line is formed in each obtuse angle part. Note that the length of the two sides of the isosceles right triangle, which are equal to each other, is equal to or longer than one-fifth the width of the wiring layer and equal to or shorter than half the width of the wiring layer. In addition, the inner circumference of the edge is also made curved in accordance with the circumference of edge.

When the wiring layer and the conductive layer are thus disposed so that the corner and the portion where the wire width changes are curved, generation of fine particles due to abnormal discharge can be suppressed in dry etching using plasma. In addition, even when fine particles which tend to gather at a depressed portion are generated, the fine particles can be washed, and yield can be expected to increase significantly. That is to say, the problems of dusts and fine particles in manufacturing steps can be solved. Further, the round corner of the wire allows electrical conduction. In addition, dusts in multiple parallel wires can be washed effectively.

According to the invention, the conductive layers are provided so as to surround the signal wiring layer, thereby the propagation characteristics of a signal received from or transmitted to an antenna can be improved. Further, excellent electromagnetic shielding properties can prevent an integrated circuit from interfering with signal wires. Accordingly, a semiconductor device with high performance and high reliability can be provided.

EMBODIMENT 2

In this embodiment, a manufacturing method of a semiconductor device of the invention including a thin film transistor and an antenna is described with reference to drawings. The semiconductor device shown in this embodiment is capable of reading and writing data without contact. Data transmission system is roughly divided into three types: electromagnetic coupling system where data is communicated by mutual induction with a pair of coils disposed opposite to each other; electromagnetic induction system where data is communicated by the induction field; and electric wave system where data is communicated by electric waves. The invention may adopt any one of the systems.

An insulating layer 81a and an insulating layer 81b are stacked as base films over a substrate 80 by sputtering, PVD (Physical Vapor Deposition), CVD (Chemical Vapor Deposition) such as low pressure CVD (LPCVD) and plasma CVD, or the like. The insulating layer 81a and the insulating layer 81b are formed using a silicon nitride oxide film (SiNO) and a silicon oxynitride film (SiON) so as to have a thickness of 10 to 200 nm (preferably, 50 to 100 nm) and 50 to 200 nm (preferably, 100 to 150 nm), respectively. The insulating layers may be formed by coating, printing, or the like. In this embodiment, the insulating layer 81a and the insulating layer 81b are formed by plasma CVD.

The insulating layer 402a and the insulating layer 402b may have a single layer structure or a stacked layer structure and may be formed of silicon oxide, silicon nitride, silicon oxynitride, silicon nitride oxide, or the like. Note that in this specification, silicon oxynitride means a substance where the composition ratio of oxygen is higher than that of nitrogen, which can also be referred to as silicon oxide containing nitrogen. Meanwhile, silicon nitride oxide means a substance where the composition ratio of nitrogen is higher than that of oxygen, which can also be referred to as silicon nitride containing oxygen. In this embodiment, a silicon nitride oxide film with a thickness of 50 nm is formed over the substrate with $SiH_4$, $NH_3$, $N_2O$, $N_2$, and $H_2$ used as a reaction gas, and a silicon oxynitride film with a thickness of 100 nm is formed with $SiH_4$ and $N_2O$ used as a reaction gas. Alternatively, a silicon nitride oxide film with a thickness of 140 nm and a silicon oxynitride film with a thickness of 100 nm may be stacked.

Subsequently, a semiconductor film is formed over the insulating layers. The semiconductor film may be formed by a known method (sputtering, LPCVD, plasma CVD, or the like) to have a thickness of 25 to 200 nm (preferably, 30 to 150 nm). In this embodiment, the semiconductor film is preferably formed of a crystalline semiconductor film that is obtained by laser crystallization of an amorphous semiconductor film.

The semiconductor film may be formed of an amorphous semiconductor (hereinafter also referred to as AS) that is formed by vapor deposition or sputtering using a semiconductor material gas typified by silane and germanium; a polycrystalline semiconductor that is obtained by crystallizing the amorphous semiconductor utilizing light energy or heat energy; or a semi-amorphous (also called microcrystal) semiconductor (hereinafter also referred to as SAS).

The SAS is a semiconductor having an intermediate structure between amorphous and crystalline (including single crystalline and polycrystalline) structures. This semiconductor has a third state that is stable in free energy, and it includes a crystalline region that has a short range order and a lattice distortion. A crystalline region of 0.5 to 20 nm can be observed in at least a part of the SAS film, and Raman spectrum is shifted to the lower wavenumber than 520 cm$^{-1}$ if silicon is mainly contained. The SAS has an X-ray diffraction pattern with peaks at (111) and (220) that are considered to be due to silicon crystal lattice. Further, the SAS is mixed with at least 1 atomic % of hydrogen or halogen for terminating dangling bonds. The SAS is obtained by glow discharge decomposition (plasma CVD) of gas containing silicon. As the gas containing silicon, not only $SiH_4$ but also $Si_2H_6$, $SiH_2Cl_2$, $SiHCl_3$, $SiCl_4$, $SiF_4$, or the like may be used. In addition, $F_2$ or $GeF_4$ may be mixed into the gas. The gas containing silicon may be diluted with $H_2$ or $H_2$ or and one or more kinds of rare gas elements selected from He, Ar, Kr, and Ne. The dilution rate is 2 to 1000, the pressure is approximately 0.1 to 133 Pa, and the power supply frequency is 1 to 120 MHz, and preferably 13 to 60 MHz. The substrate is preferably heated at a temperature of 300° C. or lower, and can be formed at a temperature of 100 to 200° C. Among impurity elements that are mainly added during deposition, atmospheric impurity elements such as oxygen, nitrogen and carbon desirably have a concentration of $1\times10^{20}$ atoms/cm$^3$ or less. In particular, the concentration of oxygen is preferably $5\times10^{19}$ atoms/cm$^3$ or less, and more preferably $1\times10^{19}$ atoms/cm$^3$ or less. When a rare gas element such as helium, argon, krypton, and neon is mixed into the SAS, the lattice distortion is further increased and the stability is thus enhanced, leading to a high quality SAS. Alternatively, as the semiconductor film, an SAS layer made of a fluorine-based gas and an SAS layer made of a hydrogen-based gas may be stacked.

An amorphous semiconductor is typified by hydrogenated amorphous silicon, and a crystalline semiconductor is typified by polysilicon. Polysilicon (polycrystalline silicon) includes a so-called high temperature polysilicon that mainly uses polysilicon formed at a process temperature of 800° C. or higher, a so-called low temperature polysilicon that mainly uses polysilicon formed at a process temperature of 600° C. or lower, a polysilicon that is obtained by crystallization after adding an element for promoting crystallization, and the like. Needless to say, a semi-amorphous semiconductor or a semiconductor partially including a crystalline phase may also be used as set forth above.

Alternatively, the semiconductor film may be formed by printing, spraying, spin coating, droplet discharging, or the like using an organic semiconductor material. In this case, the aforementioned etching step is not required, leading to reduction in the number of steps. As the organic semiconductor, a low molecular material or a high molecular material as well as an organic pigment or a conductive high molecular material may be used. The organic semiconductor material used in the invention is desirably formed of a π-electron conjugated high molecular material that has skeleton including a conjugated double bond. Typically, soluble high molecular materials may be used, such as polythiophene, polyfluorene, poly(3-alkylthiophene), polythiophene derivatives, and pentacene.

As another organic semiconductor material, a material capable of forming a semiconductor layer by processing a deposited soluble precursor may be used. The organic semiconductor material obtained through a precursor includes polythienylenevinylene, poly(2,5-thienylenevinylene), polyacetylene, polyacetylene derivatives, polyallylenevinylene, and the like.

The precursor is converted into the organic semiconductor not only by performing heat treatment but also by adding a reaction catalyst such as a hydrogen chloride gas. A solvent for dissolving these soluble organic semiconductor materials is typified by toluene, xylene, chlorobenzene, dichlorobenzene, anisole, chloroform, dichloromethane, γ-butyrlactone, butylcellosolve, cyclohexane, NMP (N-methyl-2-pyrrolidone), cyclohexanone, 2-butanon, dioxane, dimethylformamide (DMF), and tetrahydrofuran (THF).

When a crystalline semiconductor film is formed as the semiconductor film, the crystalline semiconductor film may be formed by a known method (laser crystallization, thermal crystallization, thermal crystallization using an element for promoting crystallization such as nickel, or the like). Alternatively, a microcrystalline semiconductor that is an SAS may be irradiated with laser to be crystallized, thereby increasing the crystallinity. If an element for promoting crystallization is not added, an amorphous semiconductor film is heated at 500° C. for one hour under a nitrogen atmosphere before being irradiated with a laser beam, so that hydrogen included in the amorphous semiconductor film may be released to lower the hydrogen concentration to $1\times10^{20}$ atoms/cm$^3$ or lower. This is performed because the amorphous semiconductor film is damaged when the film containing much hydrogen is irradiated with laser. The heat treatment for crystallization may be performed using a furnace, laser irradiation, irradiation with light emitted from a lamp (hereinafter referred to as lamp annealing), or the like. The heat treatment may also be performed by RTA such as GRTA (Gas Rapid Thermal Anneal) and LRTA (Lamp Rapid Thermal Anneal). The GRTA is heat treatment using a high temperature gas, and the LRTA is heat treatment using lamp light.

A metal element may be added to the amorphous semiconductor film by any method as long as the metal element can exist on the surface or inside of the amorphous semiconductor film, and it is possible to use, for example, sputtering, CVD, plasma treatment (including plasma CVD), adsorption, or a method for applying a metal salt solution. Among them, the method using a solution is simple, and is effective in easily adjusting the concentration of the metal element. Further, at this time, an oxide film is desirably formed by UV ray irradiation in an oxygen atmosphere, thermal oxidation, treatment with ozone water or hydrogen peroxide including hydroxyl radical, or the like in order to improve the wettability of the surface of the amorphous semiconductor film and to spread the water solution over the entire surface of the amorphous semiconductor film.

In order to obtain a crystal with a large grain size, a continuous wave solid state laser may be used to apply second to fourth harmonics of a fundamental wave. Typically, a second harmonic (532 nm) or a third harmonic (355 nm) of a Nd:YVO$_4$ laser (a fundamental wave of 1064 nm) is desirably used. Specifically, a laser beam emitted from a continuous wave YVO$_4$ laser is converted into a harmonic by a non-linear optical element, thereby obtaining an output of a few watts or higher. Then, the laser beam is preferably formed into a rectangular shape or an elliptical shape at an irradiated surface by an optical system to irradiate the semiconductor film. At this time, an energy density of about 0.001 to 100 MW/cm$^2$ (preferably 0.1 to 10 MW/cm$^2$) is required. Then, the semiconductor film is preferably irradiated with a laser beam at a scan rate of about 0.5 to 2000 cm/sec (preferably, 10 to 200 cm/sec).

The laser beam preferably has a linear shape to improve throughput. In addition, the laser is preferably irradiated at an incident angle θ (0<θ<90°) relative to the semiconductor film. As a result, interference of laser can be prevented.

By relatively scanning such a laser and the semiconductor film, laser irradiation can be carried out. In the laser irradiation, a marker may be formed to improve the alignment accuracy of the beam and control the start position and the end position of the laser irradiation. The marker may be formed over the substrate simultaneously with the amorphous semiconductor film.

As the laser, a continuous wave or pulsed gas laser, solid state laser, a copper vapor laser, a gold vapor laser, or the like can be used. As the gas laser, an excimer laser, an Ar laser, a Kr laser, a He—Cd laser, or the like can be used. As the solid state laser, a YAG laser, a YVO$_4$ laser, a YLF laser, a YAlO$_3$ laser, a Y$_2$O$_3$ laser, a glass laser, a ruby laser, an alexandrite laser, a Ti:sapphire laser, or the like can be used.

Alternatively, laser crystallization may be performed using a pulsed laser beam with a repetition rate of 0.5 MHz or higher, which is a much higher rate than that of tens to hundreds of Hz of a normally used laser beam. It is said that it takes several tens to several hundreds nsec to completely solidify a semiconductor film after the semiconductor film is irradiated with a pulsed laser beam. Accordingly, when adopting a repetition rate of 0.5 MHz or higher, a semiconductor film melted by a laser beam can be irradiated with the next pulsed laser beam before being solidified. Thus, the interface between the solid phase and the liquid phase can be moved continuously in the semiconductor film, and the semiconductor film with crystal grains that are continuously grown in the scan direction can thus be obtained. Specifically, it is possible to form an aggregation of crystal grains each having a width of 10 to 30 μm in the scan direction and a width of about 1 to 5 μm in the direction perpendicular to the scan direction. By forming such single crystal grains extending long in the scan direction, a semiconductor film having few crystal grain boundaries at least in the channel direction of the thin film transistor can be formed.

The laser irradiation may be performed in an inert gas atmosphere such as a rare gas and nitrogen. According to this, roughness of a semiconductor surface due to laser irradiation can be suppressed, which reduces variations in threshold voltage caused by variations in interface state density.

Crystallization of the amorphous semiconductor film may be performed by combining heat treatment and laser irradiation, or either heat treatment or laser irradiation may be performed more than once.

In this embodiment, an amorphous semiconductor film is formed over the insulating layer 81b, and crystallized to obtain a crystalline semiconductor film. The amorphous semiconductor film is made of amorphous silicon that is formed using a reaction gas of SiH$_4$ and H$_2$. In this embodiment, the insulating layer 81a, the insulating layer 81b, and the amorphous semiconductor film are continuously formed in the same chamber under a vacuum while keeping the temperature at 330° C. and changing a reaction gas.

After removing the oxide film formed over the amorphous semiconductor film, an oxide film with a thickness of 1 to 5 nm is formed by UV ray irradiation in an oxygen atmosphere, thermal oxidation, treatment with ozone water or hydrogen peroxide including hydroxyl radical, or the like. In this embodiment, Ni is used as an element for promoting crystallization. A solution containing nickel acetate of 10 ppm is applied by spin coating.

In this embodiment, after heat treatment is performed by RTA at a temperature of 750° C. for three minutes, the oxide film over the semiconductor film is removed and irradiated with a laser beam. The amorphous semiconductor film is crystallized by the aforementioned crystallization treatment, thereby forming a crystalline semiconductor film.

After the crystallization using a metal element, the metal element is reduced or removed in a gettering step. In this embodiment, the metal element is captured with the amorphous semiconductor film used as a gettering sink. First, an oxide film is formed over the crystalline semiconductor film by UV ray irradiation in an oxygen atmosphere, thermal oxidation, treatment with ozone water or hydrogen peroxide including hydroxyl radical, or the like. The thickness of the oxide film is desirably increased by heat treatment. Then, an amorphous semiconductor film is formed by plasma CVD (in this embodiment, under the condition of 350 W and 35 Pa) to have a thickness of 50 nm.

Subsequently, heat treatment is performed by RTA at a temperature of 744° C. for three minutes, thereby reducing or removing the metal element. The heat treatment may be performed under a nitrogen atmosphere. Then, the amorphous semiconductor film used as a gettering sink and the oxide film over the amorphous semiconductor film are removed by hydrofluoric acid or the like, so that a crystalline semiconductor film where the metal element is reduced or removed can be obtained. In this embodiment, the amorphous semiconductor film used as a gettering sink is removed by TMAH (Tetramethyl Ammonium Hydroxide).

The thus formed semiconductor film may be added with a small amount of impurity element (boron or phosphorus) in order to control the threshold voltage of the thin film transistor. The impurity element may be added to the amorphous semiconductor film before the crystallization step. When the impurity element is added to the amorphous semiconductor film, the impurity element can be activated by the heat treatment that is performed later for crystallization. In addition, defects and the like generated in the doping step can be improved.

Subsequently, the crystalline semiconductor film is etched using a mask. In this embodiment, after the oxide film formed over the crystalline semiconductor film is removed, another oxide film is formed. Then, a photomask is formed, and a semiconductor layer 79 is formed by processing using photolithography.

The etching step may be performed by either plasma etching (dry etching) or wet etching, though plasma etching is suitable for processing a large size substrate. As an etching gas, a fluorinated gas or a chlorinated gas such as CF$_4$, NF$_3$, Cl$_2$, and BCl$_3$ is employed, and may be appropriately added with an inert gas such as He and Ar. If the etching step is performed by atmospheric pressure discharge, a discharging process can be locally performed and it is not necessary to form a mask layer over the entire surface of the substrate.

In the invention, a conductive layer forming a wiring layer or an electrode layer, a mask layer for forming a predetermined pattern, and the like may be formed by a method for selectively forming a pattern, such as a droplet discharging method. According to the droplet discharging (ejecting) method (also called an ink jet method depending on the system), a composition droplet compounded for a specific purpose is selectively discharged (ejected) so that a predetermined pattern (a conductive layer or an insulating layer) can be formed. At this time, a region in which the pattern is formed may be subjected to treatment for controlling the wettability and the adhesion. It is also possible to use a method for transferring or drawing a pattern, such as a printing method (method for forming a pattern, such as screen printing and offset printing).

The mask used in this embodiment is made of a resin material such as epoxy resin, acrylic resin, phenol resin, novolac resin, melamine resin, and urethane resin. Alternatively, the mask may be made of an organic material such as benzocyclobutene, parylene, fluorinated arylene ether, and polyimide that transmits light, a compound material obtained by polymerization of siloxane-based polymer or the like, a composition material containing water-soluble homopolymer and water-soluble copolymer, and the like. The mask may also be formed of a commercial resist material containing a photosensitizer, for example such as a positive resist typified by a compound of novolac resin and naphthoquinone diazide that is a photosensitizer, and a negative resist typified by a base resin, diphenylsilanediol, and an acid generator. If the droplet discharging method is adopted, in using any material, the surface tension and viscosity thereof are arbitrarily controlled by adjusting the concentration of a solvent or adding a surfactant.

The oxide film over the semiconductor layer is removed, and a gate insulating layer 83 is formed to cover the semiconductor layer 79. The gate insulating layer is formed by plasma CVD, sputtering, or the like using an insulating film containing silicon so as to have a thickness of 10 to 150 nm. The gate insulating layer may have a stacked layer structure or a single layer structure and may be formed of a known material such as an oxide material or a nitride material of silicon typified by silicon nitride, silicon oxide, silicon oxynitride, and silicon nitride oxide. The insulating layer may have a three-layer structure of a silicon nitride film, a silicon oxide film, and a silicon nitride film, a single layer structure of a silicon oxynitride film, or a two-layer structure. Further, a thin silicon oxide film may be formed between the semiconductor layer and the gate insulating layer so as to have a thickness of 1 to 100 nm, preferably 1 to 10 nm, and more preferably 2 to 5 nm. The thin silicon oxide film may be obtained by forming a thermal oxide film by oxidizing the surface of the semiconductor region using GRTA, LRTA, or the like. In order to form a dense insulating film with little leak current at a low deposition temperature, a rare gas element such as argon may be mixed into a reaction gas so that the insulating film to be formed contains the rare gas element. In this embodiment, as the gate insulating layer 83, a silicon oxynitride film is formed to have a thickness of 115 nm.

After forming the insulating layer as the base film, the semiconductor layer, the gate insulating layer, the interlayer insulating layer, and the like over the substrate, oxidation or nitridation may be performed by plasma treatment so as to oxidize or nitride the surface of the substrate, the insulating layer as the base film, the semiconductor layer, the gate insulating layer, and the interlayer insulating layer. When the semiconductor layer or the insulating layer is oxidized or nitrided by plasma treatment, the surface thereof is modified to form an insulating film that has higher density than an insulating film formed by CVD or sputtering. Therefore, defects such as pinholes can be suppressed and the semiconductor device can exhibit improved characteristics. The aforementioned plasma treatment may also be applied to a gate electrode layer, a source electrode layer, a drain electrode layer, a wiring layer, and the like, so that a nitride film or an oxide film can be formed by nitridation or oxidation.

In this embodiment, after forming the gate insulating layer 83, plasma treatment 78 is performed as shown in FIG. 8A, thereby oxidizing or nitriding the gate insulating layer 83. Although not shown in FIG. 8A, an oxide film or a nitride film is formed over the gate insulating layer 83 by the plasma treatment. If the gate insulating layer 83 is made of silicon oxide ($SiO_x$) or silicon oxynitride ($SiO_xN_y$) (x>y), by oxidizing the gate insulating layer 83 by the plasma treatment under an oxygen atmosphere, a film that has higher density and less defects such as pinholes than a gate insulating film formed by CVD or sputtering can be formed over the surface of the gate insulating layer 83. On the other hand, when the gate insulating layer 83 is nitrided by the plasma treatment under a nitrogen atmosphere, a silicon nitride oxide ($SiN_xO_y$) (x>y) film can be formed as an insulating film over the surface of the gate insulating layer 83. Alternatively, after the gate insulating layer 83 is oxidized by the plasma treatment under an oxygen atmosphere, it may be nitrided by the plasma treatment under a nitrogen atmosphere.

If the film is oxidized by the plasma treatment, the plasma treatment is performed in an oxygen atmosphere (e.g., an atmosphere including oxygen ($O_2$) and a rare gas (containing at least one of He, Ne, Ar, Kr, and Xe); an atmosphere including oxygen, hydrogen ($H_2$), and a rare gas; or an atmosphere including dinitrogen monoxide and a rare gas). On the other hand, if the film is nitrided by the plasma treatment, the plasma treatment is performed in a nitrogen atmosphere (e.g., an atmosphere including nitrogen ($N_2$) and a rare gas (containing at least one of He, Ne, Ar, Kr, and Xe); an atmosphere including nitrogen, hydrogen, and a rare gas; or an atmosphere including $NH_3$ and a rare gas). As the rare gas, Ar can be used for example. Alternatively, a mixed gas of Ar and Kr may be used. Thus, the insulating film formed by the plasma treatment includes the rare gas (containing at least one of He, Ne, Ar, Kr, and Xe) used for the plasma treatment, and if Ar is used, Ar is contained in the insulating film.

The plasma treatment is performed at an electron density of $1 \times 10^{11}$ $cm^{-3}$ or more and an electron temperature of plasma of 1.5 eV or less in the atmosphere containing the gases described above. More specifically, the electron density is $1 \times 10^{11}$ to $1 \times 10^{13}$ $cm^{-3}$, and the electron temperature of plasma is 0.5 to 1.5 eV. The electron density of plasma is high and the electron temperature around an object (here, the gate insulating layer 83) formed over the substrate 80 is low; therefore, the object can be prevented from being damaged due to plasma. In addition, because of the plasma electron density as high as $1 \times 10^{11}$ $cm^{-3}$ or more, the oxide film or the nitride film formed by oxidizing or nitriding the object by the plasma treatment has improved uniformity of film thickness as compared with a film formed by CVD, sputtering, or the like, and a dense film can be formed. In addition, since the electron temperature of plasma is as low as 1.5 eV or less, the oxidation or nitridation treatment can be performed at a lower temperature than conventional plasma treatment or thermal oxidation method. For example, the oxidation or nitridation treatment can be performed sufficiently even when the plasma treatment is performed at a temperature lower by at least 100° C. than a strain point of a glass substrate. As the frequency for producing plasma, high frequency waves such as microwaves (2.45 GHz) can be employed. Note that in this specification, the plasma treatment is performed under the aforementioned conditions, unless otherwise noted.

By thus performing the plasma treatment before forming the gate electrode layer, even when coverage defects due to breakage of the gate insulating layer occur at the end portion of the semiconductor film, the semiconductor film exposed due to the coverage defects can be oxidized or nitrided. Accordingly, a short circuit between the gate electrode layer and the semiconductor film caused by the coverage defects of the gate insulating layer at the end portion of the semiconductor layer, and the like can be prevented.

Subsequently, a first conductive film with a thickness of 20 to 100 nm and a second conductive film with a thickness of 100 to 400 nm are stacked over the gate insulating layer 83 so as to be used as gate electrode layers. The first conductive film and the second conductive film may be formed by a known method such as sputtering, evaporation, and CVD. The first conductive film and the second conductive film may be made of an element selected from tantalum (Ta), tungsten (W), titanium (Ti), molybdenum (Mo), aluminum (Al), copper (Cu), chromium (Cr), and neodymium (Nd), or an alloy material or a compound material mainly containing any of the elements. Alternatively, the first conductive film and the second conductive film may be made of a semiconductor film typified by a polycrystalline silicon film added with an impurity element such as phosphorus, or an AgPdCu alloy film. The conductive film is not limited to a two-layer structure, and it is also possible to adopt, for example, a three-layer structure of a tungsten film with a thickness of 50 nm as a first conductive film, an aluminum-silicon alloy (Al—Si) film with a thickness of 500 nm as a second conductive film, and a titanium nitride film with a thickness of 30 nm as a third conductive film, which are stacked in this order. In the case of the three-layer structure, a tungsten nitride film may be used instead of the tungsten film as the first conductive film, an aluminum-titanium alloy (Al—Ti) film may be used instead of the aluminum-silicon alloy (Al—Si) film as the second conductive film, and a titanium film may be used instead of the titanium nitride film as the third conductive film. Alternatively, a single layer structure may be adopted as well. In this embodiment, a tantalum nitride (TaN) film with a thickness of 30 nm is formed as the first conductive film, and a tungsten (W) film with a thickness of 370 nm is formed as the second conductive film.

A resist mask is formed by photolithography, and the first conductive film and the second conductive film are processed into a desired shape, thereby forming a first gate electrode layer 77a and a second gate electrode layer 77b. The first gate electrode layer 77a and the second gate electrode layer 77b may be etched to a desired tapered shape by using an ICP (Inductively Coupled Plasma) etching method and appropriately controlling the etching conditions (the amount of power applied to a coiled electrode layer, the amount of power applied to an electrode layer on the substrate side, the temperature of the electrode on the substrate side, and the like). The tapered shape can be changed in angle and the like depending on the shape of the mask.

In this embodiment, a resist mask shown in Embodiment 4 is formed using an exposure mask having a different light transmittance, thereby forming a mask including regions having different film thicknesses, which reflects the shape of a processed conductive layer. The use of the mask having unevenness allows stacked gate electrode layers with different widths such as the gate electrode layer 77a and the gate electrode layer 77b, and a wiring layer where conductive layers with the same width are stacked to be formed in the same etching step. Accordingly, the conductive layers with various shapes can be formed in a small number of steps; therefore, the conductive layers having the respective required functions can be designed and the forming steps can be simplified.

As an etching gas, a chlorinated gas such as $Cl_2$, $BCl_3$, $SiCl_4$, and $CCl_4$, a fluorinated gas such as $CF_4$, $SF_6$, and $NF_3$, or $O_2$ may be used appropriately. In this embodiment, the second conductive film is etched using an etching gas containing $CF_4$, $Cl_2$, and $O_2$, and then the first conductive film is etched using an etching gas containing $CF_4$ and $Cl_2$.

In the etching step for forming the gate electrode layer, the gate insulating layer is etched to some extent and reduced in thickness in some cases (a so-called reduction in thickness).

Then, a resist mask is formed by photolithography, and the semiconductor layer 79 is added with an impurity element imparting N-type conductivity by ion doping or ion implantation, thereby forming an N-type impurity region 76a and an N-type impurity region 76b. The impurity element that imparts N-type conductivity may be an element belonging to group 15 of the periodic table, and for example, phosphorus (P) or arsenic (Ar) may be used. Although this embodiment shows an example where an N-channel thin film transistor is formed, a P-type impurity region may be formed by adding a P-type impurity element to the semiconductor layer instead of the N-type impurity element. As the impurity element imparting P-type conductivity, for example, boron (B) is used. The N-channel thin film transistor of this embodiment has impurity regions with different concentrations, and the N-type impurity region 76a that is an LDD (Lightly Doped Drain) region is a low concentration impurity region, while the N-type impurity region 76b that functions as a source region or a drain region is a high concentration impurity region.

An LDD region is formed by either of the following two methods: a gate electrode having a two or more layer structure is etched or anisotropically etched so as to have a tapered shape at a shorter side, and a lower conductive layer of the gate electrode is used as a mask; or a sidewall insulating layer is used as a mask. When adopting the latter method where a sidewall insulating layer is used as a mask, the width of the LDD region can be easily controlled and the LDD region can be surely formed. The sidewall can be formed by plasma CVD or a low pressure CVD (LPCVD) using an insulating film containing silicon.

Heat treatment, irradiation with intense light, or irradiation with a laser beam may be performed to activate the impurity element. At the same time as the activation, plasma damage to the gate insulating layer can be recovered as well as plasma damage to an interface between the gate insulating layer and the semiconductor layer.

Subsequently, an insulating layer 84 containing hydrogen is formed as a passivation film (see FIG. 8B). As the insulating layer 84, an insulating film containing silicon is formed by plasma CVD or sputtering so as to have a thickness of 100 to 200 nm. The insulating layer 84 is not limited to a silicon nitride film, and a silicon nitride oxide (SiNO) film formed by plasma CVD, or a single layer or stacked layers of another insulating film containing silicon may be used as well.

Heat treatment is performed at a temperature of 300 to 550° C. for 1 to 12 hours in a nitrogen atmosphere, thereby hydrogenating the semiconductor layer. Preferably, the heat treatment is performed at a temperature of 400 to 500° C. This is a step of terminating dangling bonds of the semiconductor layer with hydrogen contained in the insulating layer 84. This heat treatment may be performed after forming an insulating layer 86. In that case, the insulating layer 84 and the insulating layer 86 may be continuously formed by plasma CVD or the like.

The insulating layer 86 is formed as an interlayer insulating layer to cover the gate electrode layer and the gate insulating layer. In this embodiment mode, a silicon oxynitride film with a thickness of 100 nm is formed as the insulating layer 84 and a silicon oxynitride film with a thickness of 900 nm is formed as the insulating layer 86. Alternatively, a three-layer structure of a silicon oxynitride film with a thickness of 30 nm, a silicon nitride oxide film with a thickness of 140 nm, and a silicon oxynitride film with a thickness of 800 nm may be formed to cover the gate electrode layer and the gate insulating layer. The materials of the insulating layer 84 and the insulating layer 86 are not limited to the aforementioned ones, and a silicon nitride film, a silicon nitride oxide film, a silicon oxynitride film, or a silicon oxide film that is formed by sputtering or plasma CVD may also be used. Alternatively, other insulating films containing silicon may be used as a single layer structure or a stacked layer structure of three layers or more.

Further alternatively, the insulating layer 84 and the insulating layer 86 may be formed of a material selected from aluminum nitride (AlN), aluminum oxynitride (AlON), aluminum nitride oxide (AlNO) that contains more nitrogen than oxygen, aluminum oxide, diamond like carbon (DLC), carbon containing nitrogen (CN), polysilazane, and other inorganic insulating materials. A siloxane resin that includes a Si—O—Si bond may also be used. Siloxane is composed of a skeleton formed by the bond of silicon (Si) and oxygen (O), in which an organic group containing at least hydrogen (such as an alkyl group and aromatic hydrocarbon) is included as a substituent. Alternatively, a fluoro group may be used as the substituent. Further alternatively, a fluoro group and an organic group containing at least hydrogen may be used as the substituent. In addition, an organic insulating material may be used, such as polyimide, acrylic, polyamide, polyimideamide, resist, and benzocyclobutene. A coating film with high flatness may be formed by a coating method.

Subsequently, using a resist mask, contact holes (openings) extending to the semiconductor layer are formed in the insulating layer 84, the insulating layer 86, and the gate insulating layer 83. Etching may be performed once or more depending on the selectivity of materials. In this embodiment, a first etching is performed to remove the insulating layer 86 under the conditions that the insulating layer 86 made of a silicon oxynitride film, the insulating layer 84 made of a silicon nitride oxide film, and the gate insulating layer 83 have high selectivity. Then, a second etching is performed to remove the insulating layer 84 and the gate insulating layer 83, thereby forming an opening extending to the N-type impurity region 76*b* that is a source region or a drain region. In this embodiment, the first etching is performed by wet etching and the second etching is performed by dry etching. An etchant for wet etching may be a hydrofluoric acid-based solution such as a mixture solution containing ammonium hydrogen fluoride and ammonium fluoride. As an etching gas, a chlorinated gas typified by $Cl_2$, $BCl_3$, $SiCl_4$, and $CCl_4$, a fluorinated gas typified by $CF_4$, $SF_6$, and $NF_3$, or $O_2$ may be appropriately used. The etching gas may be added with an inert gas. As the added inert element, one or more kinds of elements selected from He, Ne, Ar, Kr, and Xe may be used.

A conductive film is formed to cover the openings, and the conductive film is etched to form a source or drain electrode layer 91*a* and a source or drain electrode layer 91*b* that are electrically connected to a part of either the source region or the drain region. In the same step as the formation of the source or drain electrode layer 91*a* and the source or drain electrode layer 91*b*, a conductive layer 87 is formed over the insulating layer 86. The source or drain electrode layer can be formed by depositing a conductive film by PVD, CVD, evaporation, or the like, and then etching it into a desired shape. Alternatively, a conductive layer may be selectively formed in a predetermined area by droplet discharging, printing, electrolytic plating, or the like. In addition, a reflow method or a damascene method may be used. The source or drain electrode layer is made of metal such as Ag, Au, Cu, Ni, Pt, Pd, Ir, Rh, W, Al, Ta, Mo, Cd, Zn, Fe, Ti, Zr, and Ba, Si or Ge, or an alloy or nitride material of them. A stacked structure of these elements may be used as well. In this embodiment, a titanium film with a thickness of 60 nm, a titanium nitride film with a thickness of 40 nm, an aluminum film with a thickness of 700 nm, and a titanium film with a thickness of 200 nm are stacked in this order and processed into a desired shape.

Through the aforementioned steps, an N-channel thin film transistor 85 connected to a conductive layer functioning as an antenna is completed (see FIG. 8C).

The thin film transistor is not limited to the one shown in this embodiment, and may have a double gate structure including two channel forming regions, or a triple gate structure including three channel forming regions. Further, a silicide layer may be formed in one or both of a source region and a drain region. The silicide layer may be formed of nickel, tungsten, molybdenum, cobalt, platinum, or the like.

The manufacturing method shown in this embodiment can be applied not exclusively to the thin film transistor, but to a top gate (staggered) thin film transistor, a bottom gate (planer, or inverted staggered) thin film transistor, a dual gate thin film transistor that has two gate electrode layers above and below a channel region with gate insulating films interposed therebetween, or other types of thin film transistors.

Subsequently, an insulating layer 88 functioning as an interlayer insulating layer is formed. The interlayer insulating layer provided for planarization in the invention is required to have high heat resistance, high insulating property, and high planarization rate. Such an insulating layer is preferably formed by a coating method typified by spin coating.

In this embodiment, a siloxane resin is used as a material for the insulating layer 88. The siloxane resin corresponds to a resin including a Si—O—Si bond. Siloxane is composed of a skeleton formed by the bond of silicon (Si) and oxygen (O), in which an organic group containing at least hydrogen (such as an alkyl group and aromatic hydrocarbon) is included as a substituent. Alternatively, a fluoro group may be used as the substituent. Further alternatively, a fluoro group and an organic group containing at least hydrogen may be used as the substituent.

The insulating layer 88 may be formed by dipping, spray application, a doctor knife, a roll coater, a curtain coater, a knife coater, CVD, evaporation, or the like. The insulating layer 88 may also be formed by droplet discharging, and in that case, a material solution can be saved. Alternatively, a method for transferring or drawing a pattern, such as a printing method (a method for forming a pattern, such as screen printing and offset printing), or the like may be used. The insulating layer 88 may be formed by spin coating and using an inorganic material, and in that case, silicon oxide, silicon nitride, or silicon oxynitride may be used.

The insulating layer 88 may be formed of other materials than siloxane resin that have high heat resistance and planarization rate, such as an inorganic material (e.g., silicon oxide, silicon nitride, silicon oxynitride, silicon nitride oxide, PSG (phosphosilicate glass), BPSG (boron phosphosilicate glass), or alumina), a photosensitive or non-photosensitive organic material (organic resin material, e.g., polyimide, acrylic, polyamide, polyimideamide, resist, or benzocyclobutene), a film made of one or more kinds of a low dielectric constant materials, or a stacked film of them.

Then, an opening extending to the gate electrode layer 77*b* is formed, and a signal wiring layer 89 connected to the gate electrode layer 77*b* is formed in the opening (see FIG. 9A).

The signal wiring layer 89 is a wire for electrically connecting an integrated circuit to an antenna. A conductive layer 90 functioning as an antenna is formed over the signal wiring layer 89 so that the antenna is electrically connected to an integrated circuit portion (see FIG. 9B).

The conductive layer 87 has a function of blocking electrical signals transmitted from the signal wiring layer 89. Accordingly, electromagnetic shielding properties of the signal wiring layer 89 are improved particularly in the thickness direction of the stacked layers, thereby the propagation characteristics of a signal received from or transmitted to an antenna can be improved.

The semiconductor device formed in this embodiment may be separated from the substrate in a separation step, and attached to a flexible base, thereby forming a flexible semiconductor device. The flexible base corresponds to a film made of polypropylene, polyester, vinyl, polyvinyl fluoride, polyvinyl chloride, or the like, paper of a fibrous material, or a stacked film of a base film (polyester, polyamide, an inorganic vapor deposition film, paper, or the like) and an adhesive synthetic resin film (an acrylic-based synthetic resin, an epoxy-based synthetic resin, or the like). The film may be obtained by performing heat treatment and pressure treatment to the object. In performing the heat treatment and the pressure treatment, an adhesive layer provided on the outermost surface of the film, or a layer (not an adhesive layer) that is provided on the outermost layer and melted by heat treatment is attached by applying pressure. Adhesive layers may be provided over the base, or not. The adhesive layers correspond to a layer having an adhesive agent such as a heat curing resin, an ultraviolet curing resin, an epoxy resin, and a resin additive.

Separation and attachment are performed using a separation layer, an adhesive layer, and the like. In a separation step, a separation layer is formed over the substrate 80, and an integrated circuit portion is formed over the separation layer. After removing the separation layer, only the integrated circuit portion is separated and attached to another substrate such as a film. The separation layer may be removed by dry etching or wet etching.

The separation layer is not necessarily formed over the entire surface of the substrate, and may be selectively formed as needed.

The separation layer is formed by a known method (such as sputtering and plasma CVD) using a single layer or stacked layers made of an element selected from tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), lead (Pb), osmium (Os), iridium (Ir), and silicon (Si), or an alloy material or a compound material mainly containing such an element. If the separation layer contains silicon, it may have any of an amorphous structure, a microcrystalline structure, and a polycrystalline structure.

If the separation layer has a single layer structure, for example, a tungsten layer, a molybdenum layer, or a layer containing a mixture of tungsten and molybdenum is formed. Alternatively, a layer containing an oxide or oxynitride of tungsten, a layer containing an oxide or oxynitride of molybdenum, or a layer containing an oxide or oxynitride of a mixture of tungsten and molybdenum may be formed. Note that the mixture of tungsten and molybdenum corresponds, for example, to an alloy of tungsten and molybdenum. The oxide of tungsten may also be referred to as tungsten oxide.

If the separation layer has a stacked layer structure, a tungsten layer, a molybdenum layer, or a layer containing a mixture of tungsten and molybdenum is formed as the first layer, and a layer containing an oxide, nitride, oxynitride, or nitride oxide of tungsten, molybdenum, or a mixture of tungsten and molybdenum is formed as the second layer.

If the separation layer has a stacked layer structure of a layer containing tungsten and a layer containing an oxide of tungsten, a layer containing silicon oxide may be formed over the layer containing tungsten, so that the layer containing an oxide of tungsten is formed at the interface between the tungsten layer and the silicon oxide layer. The same applies to the case of forming a layer containing a nitride, oxynitride or nitride oxide of tungsten. After a layer containing tungsten is formed, a silicon nitride layer, a silicon oxynitride layer, or a silicon nitride oxide layer may be formed thereover. The oxide of tungsten is represented by $WO_x$, where x ranges from 2 to 3. The value of x may be 2 ($WO_2$), 2.5 ($W_2O_5$), 2.75 ($W_4O_{11}$), 3 ($WO_3$), or the like. In forming the oxide of tungsten, the value of x is not particularly limited and it may be decided depending on the etching rate and the like. Note that it is a layer containing an oxide of tungsten ($WO_x$, $0<x<3$) formed by sputtering in an oxygen atmosphere that has the most desirable etching rate. Therefore, in order to reduce the manufacturing time, a layer containing an oxide of tungsten is preferably formed as the separation layer by sputtering in an oxygen atmosphere. In the case of such a separation layer, a gas or a liquid containing halogen fluoride or an interhalogen compound may be used as the etching agent. For example, chlorine trifluoride ($ClF_3$) may be used as a gas containing halogen fluoride.

Figure 10:
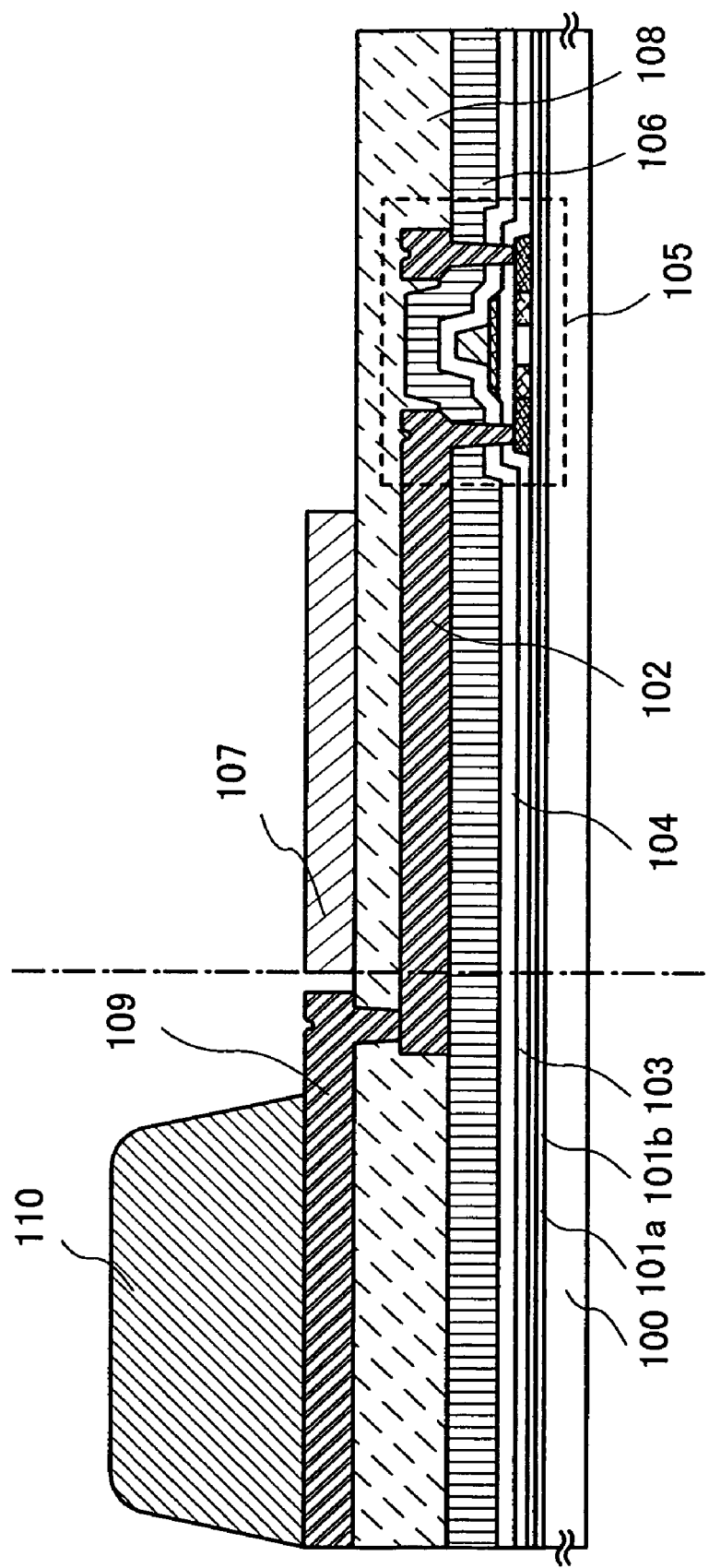
FIG. 10 is a diagram showing the semiconductor device described in Embodiment 2 of the invention.

FIG. 10 shows an example where the signal wiring layer is formed in the same step as the source or drain electrode layer 91a and the source or drain electrode layer 91b. A semiconductor device shown in FIG. 10 is formed over a substrate 100, and includes an insulating layer 101a, an insulating layer 101b, a gate insulating layer 103, a thin film transistor 105, an insulating layer 104, an insulating layer 106, a signal wiring layer 102, a signal wiring layer 109, an insulating layer 108, a signal wiring layer 109, a conductive layer 107, and a conductive layer 110 functioning as an antenna.

In FIG. 10, the signal wiring layer 102 is connected to the signal wiring layer 109 through an opening formed in the insulating layer 108, and electrically connected to the conductive layer 110 functioning as an antenna. In the same step as the signal wiring layer 109, the conductive layer 107 is formed to overlap the signal wiring layer 102 with the insulating layer 108 interposed therebetween. The conductive layer 107 has a function of blocking electrical signals transmitted from the signal wiring layer 102. Accordingly, electromagnetic shielding properties of the signal wiring layer 102 are improved particularly in the thickness direction of the stacked layers, thereby the propagation characteristics of a signal received from or transmitted to an antenna can be improved.

According to the invention, the conductive layers are provided to surround the signal wiring layer; therefore, the propagation characteristics of a signal received from or transmitted to an antenna can be improved. Further, excellent electromagnetic shielding properties can prevent an integrated circuit from interfering with signal wires. Accordingly, a semiconductor device with high performance and high reliability can be provided.

EMBODIMENT 3

In this embodiment, another example of a semiconductor device having the memory device shown in Embodiment 2 is described with reference to drawings.

The semiconductor device according to this embodiment can read and write data without contact. Data transmission system is roughly divided into three types: electromagnetic coupling system where data is communicated by mutual induction with a pair of coils disposed opposite to each other; electromagnetic induction system where data is communicated by the induction field; and electric wave system where data is communicated by electric waves. The invention may adopt any one of the systems.

One example of a structure of the semiconductor device having the memory device is described with reference to FIG. 11.

Figure 11:
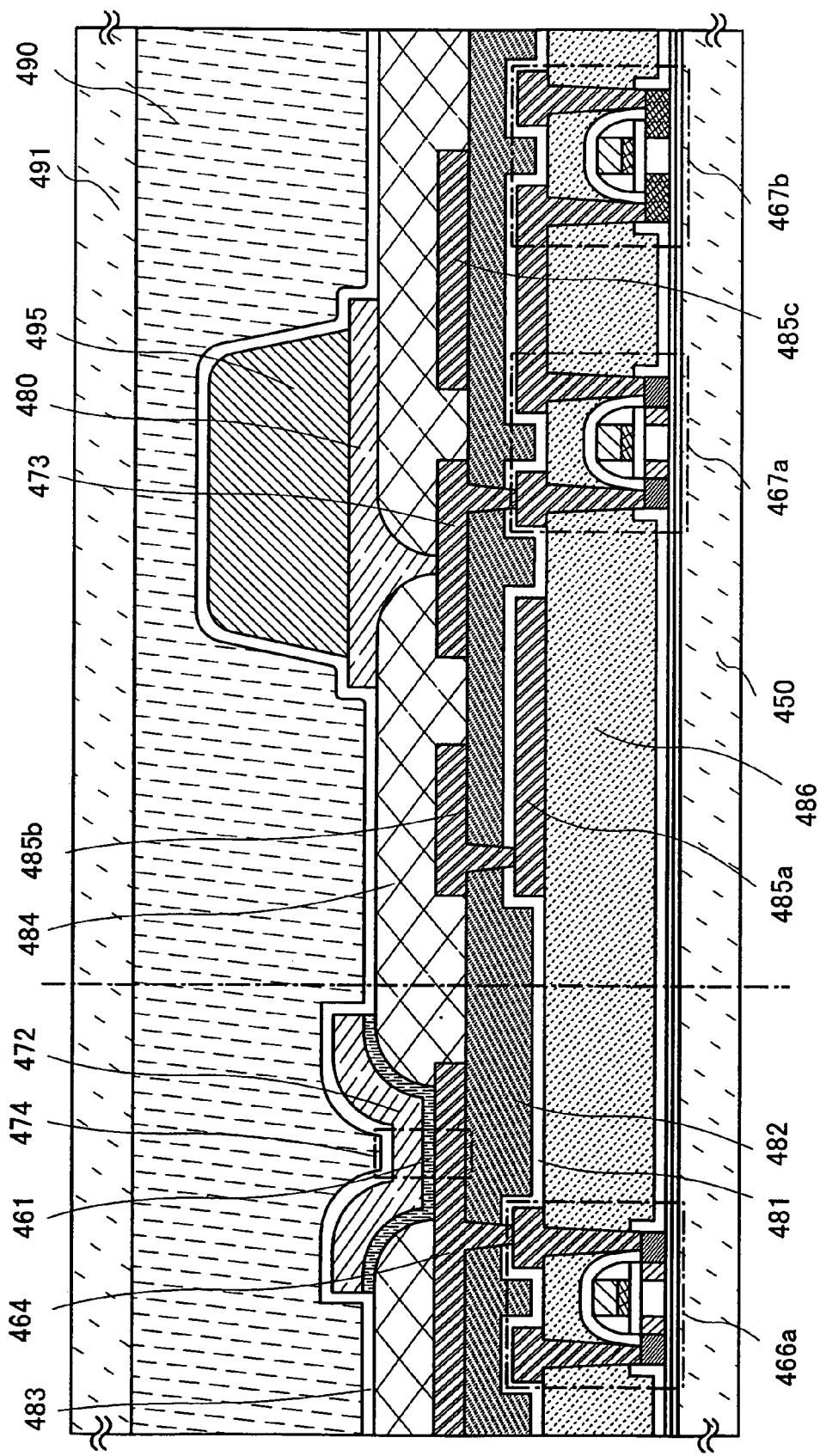
FIG. 11 is a diagram showing a semiconductor device described in Embodiment 3 of the invention.

FIG. 11 shows a semiconductor device having the memory device. A transistor 466a, a transistor 467a, and a transistor 467b are formed over a substrate 450, a memory element 474 is formed over the transistors with an insulating layer 481 and an insulating layer 482 interposed therebetween, and a conductive layer 495 functioning as an antenna is formed over a signal wiring layer 473 connected to the transistor 467a and the transistor 467b and a wiring layer 480. The signal wiring layer 473 electrically connects the transistor 467a in an integrated circuit portion to the conductive layer 495 functioning as an antenna.

An insulating layer 461 and a second conductive layer 472 are stacked over a first conductive layer 464 that is connected to the transistor 466, thereby forming the memory element 474. An insulating layer 483 functioning as a protective film is formed to cover the second conductive layer 472 and the conductive layer 495, and an insulating layer 490 is formed over the insulating layer 483 and sealed with a substrate 491. Although the insulating layer 461 is formed for each memory element as a partition to separate an insulating layer, it may be formed over the entire surface if influence of the electric field in the lateral direction between adjacent memory elements is not feared.

A conductive layer 485a is formed over an insulating layer 486 in the same step as a source or drain electrode layer of the transistor 467a, and a conductive layer 485b and a conductive layer 485c are formed in the same step as the signal wiring layer 473, so as to surround the signal wiring layer 473. The conductive layer 485a, the conductive layer 485b, and the conductive layer 485c have a function of blocking electrical signals transmitted from the signal wiring layer 473. Accordingly, electromagnetic shielding properties of the signal wiring layer 473 are improved particularly in the thickness direction of the stacked layers, thereby the propagation characteristics of a signal received from or transmitted to an antenna can be improved.

An insulating layer (also called a partition or a bank) 484 is formed to have openings in a part of the first conductive layer 464 and the signal wiring layer 473. The insulating layer 484 may be made of an inorganic insulating material such as silicon oxide, silicon nitride, silicon oxynitride, aluminum oxide, aluminum nitride, and aluminum oxynitride; acrylic acid, methacrylic acid, and a derivative thereof; a heat resistance polymer such as polyimide, aromatic polyamide, and polybenzimidazole; inorganic siloxane; or an organic siloxane-based insulating material. The insulating layer 484 may also be made of a resin material such as vinyl resin including polyvinyl alcohol, polyvinyl butyral, and the like, epoxy resin, phenol resin, novolac resin, acrylic resin, melamine resin, and urethane resin. Alternatively, the insulating layer 484 may be made of an organic material such as benzocyclobutene, parylene, fluorinated arylene ether, and polyimide, a compound material obtained by polymerization of siloxane polymer or the like, a composition material containing water-soluble homopolymer and water-soluble copolymer, and the like. As a manufacturing method of the insulating layer 484, vapor deposition such as plasma CVD and thermal CVD, or sputtering may be used. Alternatively, the insulating layer 484 may be formed by droplet discharging or printing (method for forming a pattern, such as screen printing and offset printing). An SOG film or the like obtained by coating may be used as well.

After an insulating layer or the like is formed by discharging a composition by a droplet discharging method, the surface thereof may be planarized by pressing with pressure to increase the flatness. As a pressing method, irregularities on the surface may be smoothed and reduced by moving a roller-shaped object over the surface, or the surface may be vertically pressed with a flat plate-shaped object. A heating step may be performed at the time of pressing. Alternatively, the irregularities on the surface may be eliminated with an air knife after softening or melting the surface with a solvent or the like. Further, CMP may also be used for polishing the surface. This step can be applied to planarize a surface when the irregularities are caused by a droplet discharging method.

The insulating layer 461 is made of an organic insulator, an organic compound of which the conductivity is changed by an electrical effect or an optical effect, an inorganic insulator, or a layer including a mixture of an organic compound and an inorganic compound. The insulating layer 461 may be provided using a single layer or stacked layers. In addition, a mixed layer of an organic compound and an inorganic compound, and a layer including another organic compound of which the conductivity is changed by an electrical effect or an optical effect may be stacked.

As an inorganic insulator capable of forming the insulating layer 461, silicon oxide, silicon nitride, silicon oxynitride, silicon nitride oxide, or the like can be used.

As an organic insulator capable of forming the insulating layer 461, an organic resin typified by polyimide, acrylic, polyamide, benzocyclobutene, epoxy, or the like can be used.

As an organic compound capable of forming the insulating layer 461, of which the conductivity is changed by an electrical effect or an optical effect, an organic compound material having a high hole transporting property or an organic compound material having a high electron transporting property can be used.

An organic compound material having a high hole transporting property includes: an aromatic amine-based compound (namely, a compound having a bond of benzene ring and nitrogen) such as 4,4'-bis[N-(1-naphthyl)-N-phenyl-amino]-biphenyl (abbreviation: α-NPD), 4,4'-bis[N-(3-methylphenyl)-N-phenyl-amino]-biphenyl (abbreviation: TPD), 4,4',4"-tris(N,N-diphenyl-amino)-triphenylamine (abbreviation: TDATA), 4,4',4"-tris[N-(3-methylphenyl)-N-phenyl-amino]-triphenylamine (abbreviation: MTDATA), and 4,4'-bis(N-(4-(N,N-di-m-tolylamino)phenyl)-N-phenylamino)biphenyl (abbreviation: DNTPD); phthalocyanine (abbreviation: $H_2Pc$); and a phthalocyanine compound such as copper phthalocyanine (abbreviation: CuPc), and vanadyl phthalocyanine (abbreviation: VOPc). The substances described above are mainly a substance having a hole mobility of $10^{-6}$ $cm^2$ Vs or higher. However, a substance other than the substances described above may also be used as long as it has a hole transporting property higher than an electron transporting property.

When a mixed layer of an organic compound and an inorganic compound is provided, it is preferable to combine an organic compound material having a high hole transporting property and an inorganic compound material which can easily receive electrons. When adopting such a structure, many hole carriers are generated in the organic compound where few carriers are originally included, and very favorable hole injecting and hole transporting properties can be obtained. As a result, the organic compound layer can have good conductivity.

As the inorganic compound material which can easily receive electrons, a metal oxide, a metal nitride, or a metal oxynitride of a transition metal belonging to any of groups 4 to 12 of the periodic table can be used. Specifically, titanium oxide ($TiO_x$), zirconium oxide ($ZrO_x$), vanadium oxide ($VO_x$), molybdenum oxide ($MoO_x$), tungsten oxide ($WO_x$), tantalum oxide ($TaO_x$), hafnium oxide ($HfO_x$), niobium oxide ($NbO_x$), cobalt oxide ($Co_x$), rhenium oxide ($ReO_x$), ruthenium oxide ($RuO_x$), zinc oxide (ZnO), nickel oxide ($NiO_x$), copper oxide ($CuO_x$), or the like can be used. Although the oxides are shown as specific examples here, it is needless to say that a nitride and an oxynitride of these metals may also be used.

The organic compound material having a high electron transporting property includes: a material composed of a metal complex having a quinoline skeleton or a benzoquinoline skeleton such as tris(8-quinolinolato)aluminum (abbreviation: $Alq_3$), tris(4-methyl-8-quinolinolato)aluminum (abbreviation: $Almq_3$), bis (10-hydroxybenzo[h]-quinolinato) beryllium (abbreviation: $BeBq_2$), and bis (2-methyl-8-quinolinolato)-4-phenylphenolato-aluminum (abbreviation: BAlq), and the like. In addition, a metal complex material having an oxazole ligand or a thiazole ligand may also be used, such as bis[2-(2-hydroxyphenyl)benzooxazolate]zinc (abbreviation: $Zn(BOX)_2$), and bis[2-(2-hydroxyphenyl)benzothiazolate]zinc (abbreviation: $Zn(BTZ)_2$). Further, in addition to the metal complex, 2-(4-biphenyl)-5-(4-tert-butylphenyl)-1,3,4-oxadiazole (abbreviation: PBD); 1,3-bis[5-(p-tert-butylphenyl)-1,3,4-oxadiazole-2-yl]benzene (abbreviation: OXD-7); 3-(4-tert-butylphenyl)-4-phenyl-5-(4-biphenylyl)-1,2,4-triazole (abbreviation: TAZ); 3-(4-tert-butylphenyl)-4-(4-ethylphenyl)-5-(4-biphenylyl)-1,2,4-triazole (abbreviation: p-EtTAZ); bathophenanthroline (abbreviation: BPhen); bathocuproin (abbreviation: BCP) or the like may be used. The substances described above are mainly a substance having an electron mobility of $10^{-6}$ $cm^2/Vs$ or higher. However, a substance other than the substances described above may also be used as long as it has an electron transporting property higher than a hole transporting property.

When a mixed layer of an organic compound and an inorganic compound is provided, it is preferable to combine an organic compound material having a high electron transporting property and an inorganic compound material which can easily donate electrons. When adopting such a structure, many electron carriers are generated in the organic compound where few carriers are originally included, and very favorable electron injecting and electron transporting properties can be obtained. As a result, the organic compound layer can have good conductivity.

As the inorganic compound material which can easily donate electrons, alkali metal oxide, alkaline earth metal oxide, rare earth metal oxide, alkali metal nitride, alkaline earth metal nitride, or rare earth metal nitride can be used. Specifically, lithium oxide ($LiO_x$), strontium oxide ($SrO_x$), barium oxide ($BaO_x$), erbium oxide ($ErO_x$), sodium oxide ($NaO_x$), lithium nitride ($LiN_x$), magnesium nitride ($MgN_x$), calcium nitride ($CaN_x$), yttrium nitride ($YN_x$), lanthanum nitride ($LaN_x$), or the like can be used.

Alternatively, the inorganic compound material may be any inorganic compound material which can easily receive electrons from an organic compound, or easily donate electrons to an organic compound. In addition to aluminum oxide ($AlO_x$), gallium oxide ($GaO_x$), silicon oxide ($SiO_x$), germanium oxide ($GeO_x$), indium tin oxide (ITO), and the like, various metal oxides, metal nitrides, or metal oxynitrides may be used.

When the insulating layer 461 is made of a compound selected from metal oxides or metal nitrides and a compound having a high hole transporting property, it may be added with a compound with large steric hindrance (having a spatial spread differently from a planar structure). As the compound with large steric hindrance, 5,6,11,12-tetraphenyltetracene (abbreviation: rubrene) is preferably used. Alternatively, hexaphenylbenzene, t-butylperylene, 9,10-di(phenyl)anthracene, coumalin 545T, or the like may also be used. In addition, dendrimer or the like is also effectively used.

Moreover, between a layer made of an organic compound material having a high electron transporting property and a layer made of an organic compound material having a high hole transporting property, a light emitting substance may be provided such as 4-dicyanomethylene-2-methyl-6-[2-(1,1,7,7-tetramethyl-julolidin-9-yl)ethenyl]-4H-pyran (abbreviation: DCJT), (4-dicyanomethylene-2-t-butyl-6-[2-(1,1,7,7-tetramethyl-julolidin-9-yl)ethenyl]-4H-pyran, periflanthene, 2,5-dicyano-1,4-bis[(10-methoxy-1,1,7,7-tetramethyl-julolidin-9-yl)ethenyl]benzene, N,N'-dimethylquinacridone (abbreviation: DMQd), coumarin 6, coumarin 545T, tris(8-quinolinolato)aluminum (abbreviation: $Alq_3$), 9,9'-bianthryl, 9,10-diphenylanthracene (abbreviation: DPA), 9,10-bis(2-naphthyl)anthracene (abbreviation: DNA), and 2,5,8,11-tetra-t-butylperylene (abbreviation: TBP).

The insulating layer 461 may be made of a material of which the resistance is changed by an optical effect. For example, a conjugated polymer doped with a compound (photoacid generator) that generates acid by absorbing light can be used. As the conjugated polymer, polyacetylene, poly (phenylene vinylene), polythiophene, polyaniline, poly(phenylene ethynylene), or the like can be used. As the photoacid generator, aryl sulfonium salt, aryl iodonium salt, o-nitrobenzyl tosylate, aryl sulfonic acid p-nitrobenzyl ester, sulfonyl acetophenone, Fe-allene complex $PF_6$ salt, or the like can be used.

The insulating layer 461 can be formed by evaporation, electron beam evaporation, sputtering, CVD, or the like. In addition, a mixed layer including an organic compound and an inorganic compound can be formed by simultaneously depositing each material, and it can be formed by combining the same kind of methods or different kinds of methods, such as co-evaporation by resistance heating evaporation, co-evaporation by electron beam evaporation, co-evaporation by resistance heating evaporation and electron beam evaporation, deposition by resistance heating evaporation and sputtering, and deposition by electron beam evaporation and sputtering.

The insulating layer 461 is formed to have such a thickness that the conductivity of the memory element is changed by an electrical effect or an optical effect.

The second conductive layer 472 and the wiring layer 480 can be formed using the same material as the first conductive layer 464. Additionally, the second conductive layer 472 and the wiring layer 480 can be formed in the same step. In this embodiment, data is written to the memory element by an electrical effect or an optical effect. When data writing is performed by an optical effect, one or both of the first conductive layer 464 and the second conductive layer 472 are provided to transmit light. The conductive layer that transmits light is formed using a transparent conductive material, or formed to have a thickness to transmit light when a transparent conductive material is not used. As the transparent conductive material, indium tin oxide (ITO), zinc oxide (ZnO), indium zinc oxide (IZO), gallium doped zinc oxide (GZO), or other conductive oxide materials transmitting light can be used. Alternatively, ITO, indium tin oxide containing silicon oxide (hereinafter referred to as ITSO), or indium oxide containing silicon oxide may further be mixed with 2 to 20% of zinc oxide (ZnO).

A highly conductive element, compound, or the like is used as a material for the first conductive layer 464 and the second conductive layer 472. In this embodiment, the insulating layer 461 is made of a substance of which the crystal state, the conductivity, and the shape are changed by an electrical effect or an optical effect. The conductivity of the memory element having the aforementioned structure is changed before and after applying a voltage; therefore, the memory element can store two values corresponding to "initial state" and "state after conductivity change".

The insulating layer 483 may be made of an inorganic insulating material such as silicon oxide, silicon nitride, silicon oxynitride, aluminum oxide, aluminum nitride, and aluminum oxynitride; acrylic acid, methacrylic acid, and a derivative thereof; a heat resistance polymer such as polyimide, aromatic polyamide, and polybenzimidazole; inorganic siloxane including a Si—O—Si bond among compounds containing silicon, oxygen, and hydrogen; or organic siloxane where hydrogen bonded to silicon is substituted by an organic group such as methyl and phenyl. Alternatively, a resin material such as vinyl resin including polyvinyl alcohol, polyvinyl butyral, and the like, epoxy resin, phenol resin, novolac resin, acrylic resin, melamine resin, and urethane resin may be used. Further, the insulating layer 483 may also be made of an organic material such as benzocyclobutene, parylene, fluorinated arylene ether, and polyimide, a compound material obtained by polymerization such as siloxane polymer, a composition material containing water-soluble homopolymer and water-soluble copolymer, or the like. As a manufacturing method of the insulating layer 483, vapor deposition such as plasma CVD and thermal CVD, or sputtering may be used. Alternatively, the insulating layer 483 may be formed by droplet discharging or printing (method for forming a pattern, such as screen printing and offset printing). An SOG film or the like obtained by coating may be used as well. A carbon film or a DLC film may also be used. Since a DLC film can be deposited at a temperature of room temperature to 100° C., it can be easily formed over the insulating layer 461 even when the insulating layer 461 has a low heat resistance. The DLC film can be formed by plasma CVD (typically, RF plasma CVD, microwave CVD, electron cyclotron resonance (ECR) CVD, hot-filament CVD, or the like), combustion-flame, sputtering, ion beam evaporation, laser evaporation, or the like. As a reaction gas used for deposition, hydrogen gas and hydrocarbon-based gas (for example, $CH_4$, $C_2H_2$, $C_6H_6$, or the like) are used. These gases are ionized by glow discharge, and after being accelerated in velocity, the resultant ions collides with a cathode that is applied with negative self-bias, thereby depositing a film. Further, a CN film may be formed using $C_2H_4$ gas and $N_2$ gas as a reaction gas. The DLC film has a beneficial effect of blocking oxygen.

The conductive layer 495 functioning as an antenna can be made of an element selected from gold (Au), platinum (Pt), nickel (Ni), tungsten (W), molybdenum (Mo), cobalt (Co), copper (Cu), aluminum (Al), manganese (Mn), and titanium (Ti), or an alloy material or the like containing some of these elements. The conductive layer 495 functioning as an antenna can be formed by evaporation, sputtering, CVD, printing such as screen printing and gravure printing, droplet discharging, or the like.

In the aforementioned structure described in this embodiment, a rectifying element may be provided between the first conductive layer 464 and the insulating layer 461. The rectifying element refers to a transistor where a gate electrode and a drain electrode are connected to each other, or a diode. When the rectifying element is provided, current flows in only one direction, and thus errors are reduced and reading margin is improved. Note that the rectifying element may be provided between the insulating layer 461 and the second conductive layer 472.

The memory device may be either a passive matrix type or an active matrix type. In the passive matrix memory device, a plurality of memory elements are connected to the same transistor. Meanwhile, in the active matrix memory device, each memory element is connected to one transistor.

Although this embodiment shows the case where the memory element 474 or the conductive layer 495 functioning as an antenna is provided over the element forming layer having the transistor 467a and the transistor 467b, the invention is not limited to this structure, and the memory element 474 or the conductive layer 495 functioning as an antenna may be formed under or in the same layer as the element forming layer. An integrated circuit is constituted by the element forming layer.

The conductive layer functioning as an antenna may be formed directly in the integrated circuit portion as shown in this embodiment, or a substrate provided with the conductive layer functioning as an antenna may be attached to a substrate provided with the integrated circuit portion with an adhesive resin. In that case, the integrated circuit portion may be electrically connected to the conductive layer through conductive fine particles contained in the resin. Alternatively, the substrate provided with the conductive layer functioning as an antenna may be attached to the substrate provided with the integrated circuit portion by using a conductive adhesive such as silver paste, copper paste, and carbon paste, or by soldered connections.

In this manner, a semiconductor device provided with the memory device and the antenna can be completed. Further, in this embodiment, the element forming layer may be provided by forming a transistor over a substrate, or by forming a field effect transistor over a semiconductor substrate such as a Si substrate. Note that the element forming layer may be formed over an SOI substrate. In that case, the SOI substrate may be formed by a method of attaching wafers, or by a method called SIMOX where an insulating layer is formed in a Si substrate by implanting oxygen ions into the substrate. In addition, a sensor may be provided to be connected to a transistor.

The integrated circuit portion may be formed by evaporation, sputtering, CVD, printing, droplet discharging, or the like. Different methods may be used for forming each element. For example, a transistor that requires high speed operation may be provided by forming a semiconductor layer made of Si or the like over a substrate and crystallizing the semiconductor layer by heat treatment, and then a transistor functioning as a switching element may be formed as an organic transistor over an element forming layer by printing or droplet discharging.

A sensor may be provided to be connected to a transistor. As the sensor, an element for detecting properties such as temperature, humidity, illuminance, gas, gravity, pressure, sound (vibration), and acceleration, by a physical means or a chemical means can be given. The sensor is typically formed by a semiconductor element such as a resistor, a capacitive coupling element, an inductive coupling element, a photovoltaic element, a photoelectric converter, a thermoelectromotive force element, a transistor, a thermistor, and a diode.

This embodiment may be implemented in combination with any of the aforementioned embodiment modes and embodiments. The substrate 450 and the substrate 491 shown in this embodiment are formed using a flexible substrate, and when the elements are attached onto a flexible substrate, a flexible semiconductor device can be obtained. The flexible substrate corresponds to a film made of polypropylene, polyester, vinyl, polyvinyl fluoride, polyvinyl chloride, or the like, paper of a fibrous material, or a stacked film of a base film (polyester, polyamide, an inorganic vapor deposition film, paper, or the like) and an adhesive synthetic resin film (an acrylic-based synthetic resin, an epoxy-based synthetic resin, or the like). The film may be obtained by performing heat treatment and pressure treatment to the subject. In performing the heat treatment and the pressure treatment, an adhesive layer provided on the outermost surface of the film, or a layer (not an adhesive layer) that is provided on the outermost layer and melted by heat treatment is attached by applying pressure. Adhesive layers may be provided over the substrate, or not. The adhesive layers correspond to a layer having an adhesive agent such as a heat curing resin, an ultraviolet curing resin, an epoxy resin, and a resin additive.

According to the invention, the conductive layers are provided to surround the signal wiring layer; therefore, the propagation characteristics of a signal received from or transmitted to an antenna can be improved. Further, excellent electromagnetic shielding properties can prevent an integrated circuit from interfering with signal wires. Accordingly, a semiconductor device with high performance and high reliability can be provided.

EMBODIMENT 4

Described in this embodiment is a processing method that can be used for manufacturing the semiconductor device of the invention.

In this embodiment, a resist is processed into a desired shape using an exposure mask to obtain a resist pattern that is used for forming a thin film transistor, a capacitor, a wire, and the like, which are used for an integrated circuit of the semiconductor device.

An exposure mask used in this embodiment, which is provided with a diffraction grating pattern or an assist pattern formed of a semi-transparent film and having a function of decreasing light intensity, is described with reference to FIGS. 16A to 16D.

Figure 16A:
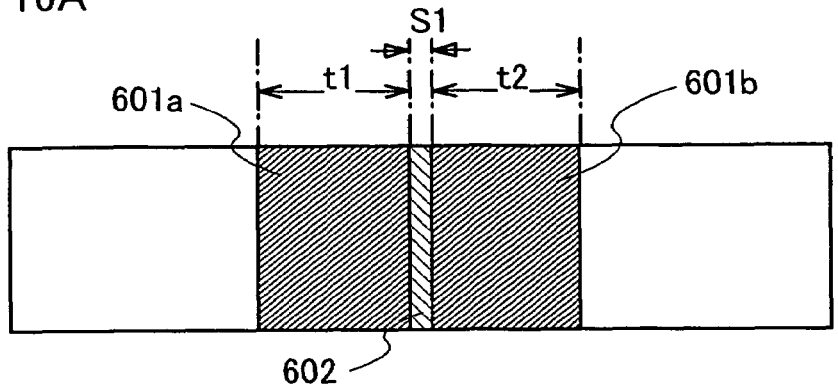
FIGS. 16A to 16D are top views and cross sectional views of an exposure mask that can be applied to the invention (Embodiment 4).
Figure 16B:
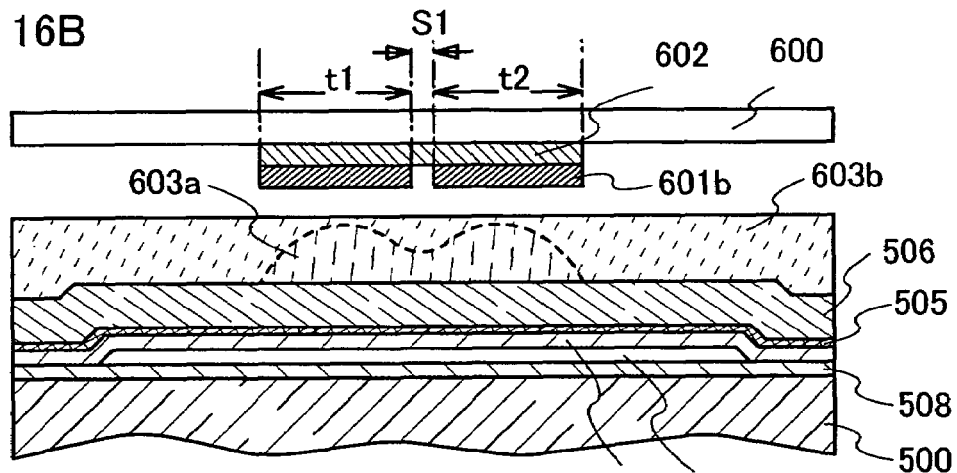

FIG. 16A is an enlarged top view of a portion of an exposure mask. FIG. 16B shows a cross sectional view of the portion of the exposure mask corresponding to FIG. 16A. FIG. 16B shows the exposure mask and the corresponding substrate over the entire surface of which a resist is formed by coating.

Figure 15A:
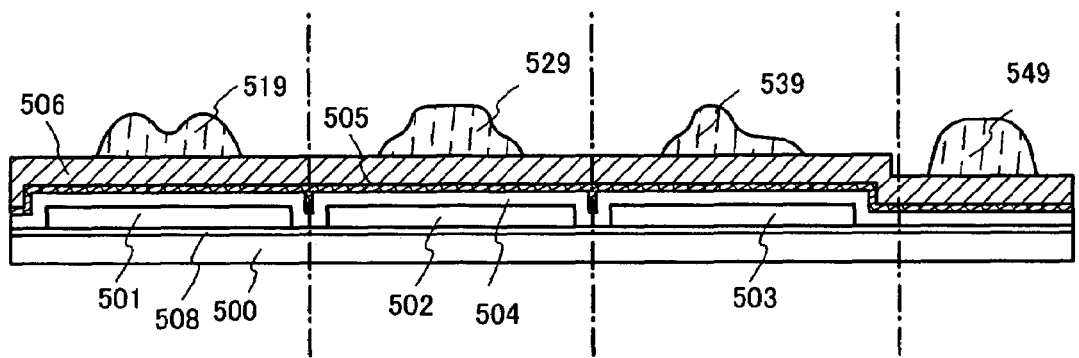
FIGS. 15A to 15C are diagrams each showing a manufacturing method of a semiconductor device, which is described in Embodiment 4 of the invention.
Figure 15B:
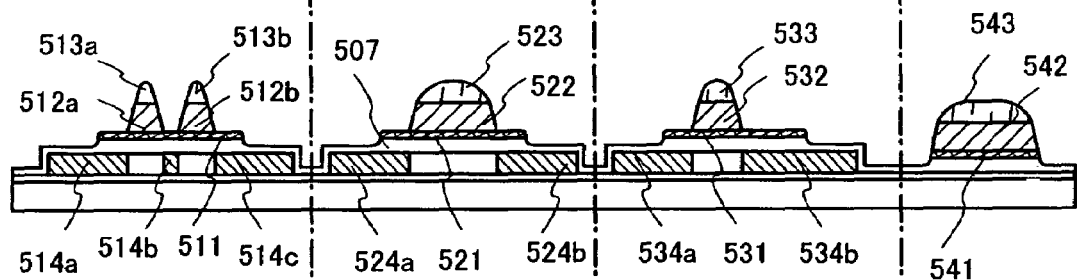
Figure 15C:
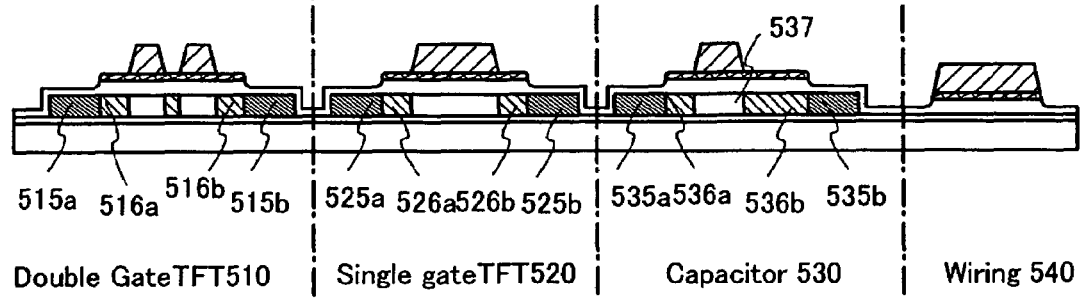

FIGS. 16A to 16D correspond to FIGS. 15A to 15C. A resist pattern 519 manufactured in FIGS. 16A to 16D is used for manufacturing a double gate TFT 510 in FIGS. 15A to 15C.

In FIG. 16A, the exposure mask includes light shielding portions 601a and 601b made of a metal film such as Cr, and a semi-transparent film 602 as an assist pattern. The width of the light shielding portion 601a is denoted by t1, the width of the light shielding portion 601b is denoted by t2, and the width of the semi-transparent film 602 is denoted by S1. The distance between the light shielding portion 601a and the light shielding portion 601b can also be denoted by S1.

In the exposure mask shown in FIG. 16B, the semi-transparent film 602 made of MoSiN is formed over a light transmitting base 600, and the light shielding portions 601a and 601b made of a metal film such as Cr are stacked over the semi-transparent film 602. The semi-transparent film 602 may also be formed of MoSi, MoSiO, MoSiON, CrSi, or the like.

When a resist film is exposed to light using the exposure mask shown in FIGS. 16A and 16B, a non-exposed region 603a and an exposed region 603b are formed. Light is transmitted around the light shielding portions and through the semi-transparent film during exposure so that the exposed region 603b shown in FIG. 16B is formed.

Then, when development is carried out, the exposed region 603a is removed and a resist pattern 519 shown in FIG. 15A can be obtained.

Figure 16C:
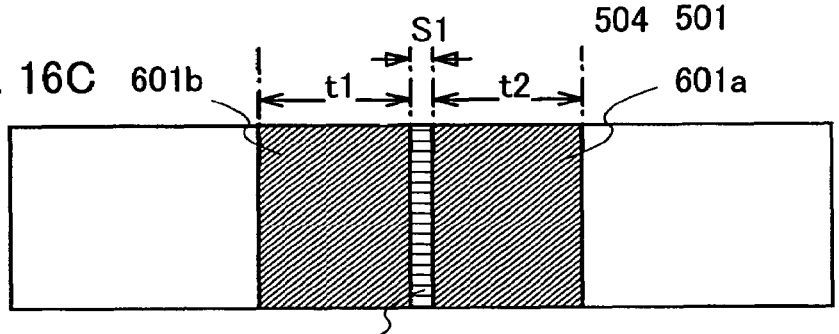

As another example of the exposure mask, FIG. 16C shows a top view of an exposure mask where a diffraction grating pattern 612 having a plurality of slits is provided between the light shielding portion 601a and the light shielding portion 601b. The use of the exposure mask shown in FIG. 16C also allows the resist pattern 519 shown in FIG. 15A to be obtained as well.

Figure 16D:
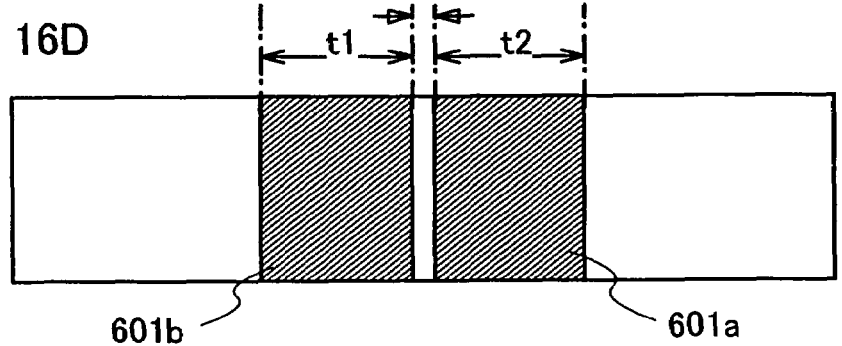

As another example of the exposure mask, FIG. 16D shows a top view of an exposure mask where a distance of the exposure limit or less is provided between the light shielding portion 601a and the light shielding portion 601b. For example, when exposure is carried out using an exposure mask with t1 of 6 μm, t2 of 6 μm, and S1 of 1 μm under optimal exposure conditions, a TFT with a double gate structure where the distance between two channel forming regions is less than 2 μm can be manufactured in accordance with the manufacturing process described in Embodiment Mode 1. The use of the exposure mask shown in FIG. 16D also allows the resist pattern 519 shown in FIG. 15A to be obtained as well.

When the resist film is thus processed in accordance with the method shown in FIGS. 16A to 16D, minute processing can be selectively carried out without increasing the number of steps, and various resist patterns can be obtained. FIGS. 15A to 15C show examples of forming the double gate TFT 510, a single gate TFT 520, a capacitor 530, and a wire 540 using such a resist pattern.

In FIG. 15A, an insulating layer 508 is formed over a substrate 500, and a semiconductor layer 501, a semiconductor layer 502, and a semiconductor layer 503 are formed over the insulating layer 508. A gate insulating layer 504, a first conductive film 505, and a second conductive film 506 are formed to cover the semiconductor layer 501, the semiconductor layer 502, and the semiconductor layer 503, over which a resist pattern 519, a resist pattern 529, a resist pattern 539, and a resist pattern 549 each having a different shape are formed by the method shown in FIGS. 16A to 16D.

The resist pattern 519 has a shape including two projecting portions, the resist pattern 529 has a shape with slightly stepped side portions, the resist pattern 539 has a shape including a projecting portion disposed off-center, and the resist pattern 549 has a shape that is not stepped and includes neither a depressed portion nor a projecting portion.

Etching process is carried out using the resist pattern 519, the resist pattern 529, the resist pattern 539, and the resist pattern 549, thereby forming a first gate electrode layer 511, a second gate electrode layer 512a, a second gate electrode layer 512b, a first gate electrode layer 521, a second gate electrode layer 522, a first gate electrode layer 531, a second gate electrode layer 532, a first wiring layer 541, and a second wiring layer 542. An impurity element having one conductivity type is added to the semiconductor layer 501, the semiconductor layer 502, and the semiconductor layer 503 with the second gate electrode layer 512a, the second gate electrode layer 512b, the second gate electrode layer 522, and the second gate electrode layer 532 used as masks, thereby forming a low concentration impurity region 514a, a low concentration impurity region 514b, a low concentration impurity region 514c, a low concentration impurity region 524a, a low concentration impurity region 524b, a low concentration impurity region 534a, and a low concentration impurity region 534b (see FIG. 15B).

Further, an impurity element having one conductivity type is added to the semiconductor layer 501, the semiconductor layer 502, and the semiconductor layer 503 with the first gate electrode layer 511, the second gate electrode layer 512a, the second gate electrode layer 512b, the first gate electrode layer 521, the second gate electrode layer 522, the first gate electrode layer 531, and the second gate electrode layer 532 used as masks, thereby forming a high concentration impurity region 515a, a high concentration impurity region 515b, a low concentration impurity region 516a, a low concentration impurity region 516b, a high concentration impurity region 525a, a high concentration impurity region 525b, a low concentration impurity region 526a, a low concentration impurity region 526b, a high concentration impurity region 535a, a high concentration impurity region 535b, a low concentration impurity region 536a, and a low concentration impurity region 536b. Then, a resist pattern 513a, a resist pattern 513b, a resist pattern 523, a resist pattern 533, and a resist pattern 543 are removed to form the double gate TFT 510, the single gate TFT 520, the capacitor 530, and the wire 540 (see FIG. 15C).

If an impurity element imparting N-type conductivity (e.g., phosphorus (P)) is used as the impurity element to be added, an N-channel TFT having an N-type impurity region can be manufactured. Meanwhile, if an impurity element imparting P-type conductivity (e.g., boron (B)) is used as the impurity element to be added, a P-channel TFT having a P-type impurity region can be manufactured.

By controlling the doping conditions and the like for adding an impurity element having one conductivity type, the low concentration impurity regions are not formed and all the impurity regions can be made high concentration impurity regions. This embodiment shows an example where impurity regions with different concentrations are formed by adding an impurity element having one conductivity type in two steps. However, the TFT having a low concentration impurity region and a high concentration impurity region and the capacitor as shown in FIG. 15C can be manufactured in one step of adding an impurity element having one conductivity type.

The two kinds of TFTs of the double gate TFT 510 and the single gate TFT 520 can be manufactured in the same step. In the double gate TFT 510, the second gate electrode layer 512a and the second gate electrode layer 512b that are adjacent to each other are formed over the first gate electrode layer 511. The distance between the second gate electrode layer 512a and the second gate electrode layer 512b can be reduced, leading to reduction in the width of the low concentration impurity region 514b and reduction in the size of the TFT. Accordingly, miniaturization is enabled, which results in refinement, high performance, and lightweight of a semiconductor device.

In the capacitor 530, the first gate electrode layer 531 can be formed to have a larger width than the second gate electrode layer; therefore, the area of the low concentration impurity region 536b can be increased. Since the capacitance between the low concentration impurity region and the gate electrode layer is larger than that between a region 537 added with no impurity elements and the gate electrode layer, large capacitance can be obtained by increasing the area of the low concentration impurity region 536b under the first gate electrode layer 531.

In the wire 540, the first wiring layer 541 and the second wiring layer 542 can be stacked to have approximately the same width, unlike other gate electrode layers each having a reduced width. Accordingly, a low resistance wiring layer can be obtained as well as a minute wiring layer.

As set forth above, according to this embodiment, conductive layers and insulating layers can be processed in the same step so as to have different sizes in accordance with the desired performance. Thus, different kinds of TFTs and wiring layers with different sizes can be manufactured without increasing the number of steps. This embodiment can be implemented in combination with any of Embodiment Modes 1 to 5 and Embodiments 1 to 3.

EMBODIMENT 5

Figure 13A:
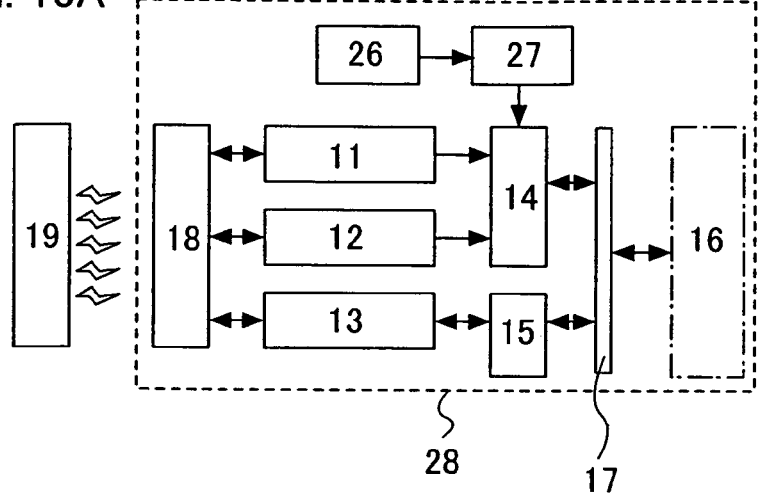
FIGS. 13A and 13B are views each showing an application example of a semiconductor device, which is described in Embodiment 5 of the invention.

A configuration of a semiconductor device according to this embodiment is described with reference to FIG. 13A. As shown in FIG. 13A, a semiconductor device 28 of the invention has a function of communicating data without contact, and includes a power supply circuit 11, a clock generation circuit 12, a data demodulation/modulation circuit 13, a control circuit 14 for controlling other circuits, an interface circuit 15, a memory circuit 16, a data bus 17, an antenna (antenna coil) 18, a sensor 26, and a sensor circuit 27.

The power supply circuit 11 generates, in accordance with an AC signal inputted from the antenna 18, various power supplies to be supplied to each circuit in the semiconductor device 28. The clock generation circuit 12 generates, in accordance with an AC signal inputted from the antenna 18, various clock signals to be supplied to each circuit in the semiconductor device 28. The data demodulation/modulation circuit 13 has a function of demodulating/modulating data to be communicated with a reader/writer 19. The control circuit 14 has a function of controlling the memory circuit 16. The antenna 18 has a function of transmitting and receiving electromagnetic waves or electric waves. The reader/writer 19 communicates with and controls the semiconductor device 28 and processes the data of the semiconductor device 28. Note that the configuration of the semiconductor device is not limited to the aforementioned one, and other elements, for example such as a limiter circuit of a power supply voltage and hardware dedicated to encryption may be additionally provided.

The memory circuit 16 has a memory element where an insulating layer or a phase change layer is sandwiched between a pair of conductive layers. Note that the memory circuit 16 may have only the memory element where an insulating layer or a phase change layer is sandwiched between a pair of conductive layers, or may have another memory circuit with a different configuration. The memory circuit with a different configuration corresponds, for example, to one or more of a DRAM, an SRAM, an FeRAM, a mask ROM, a PROM, an EPROM, an EEPROM, and a flash memory.

The sensor 26 is formed of a semiconductor element such as a resistor, a capacitive coupling element, an inductive coupling element, a photovoltaic element, a photoelectric converter, a thermoelectromotive force element, a transistor, a thermistor, and a diode. The sensor circuit 27 detects changes in impedance, reactance, inductance, voltage, or current, and performs analog/digital (A/D) conversion to output a signal to the control circuit 14.

EMBODIMENT 6

According to the invention, a semiconductor device functioning as a processor chip (also called a wireless chip, a wireless processor, a wireless memory, or a wireless tag) can be obtained. The semiconductor device of the invention can be widely used, and it may be incorporated in various objects, for example, such as bills, coins, securities, certificates, bearer bonds, containers for packages, books, recording media, personal belongings, vehicles, foods, clothes, healthcare items, commodities, medicals, and electronic apparatuses.

Figure 14A:
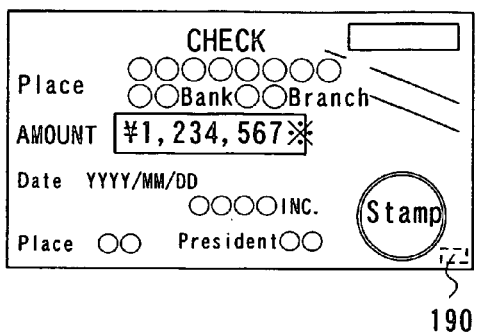
FIGS. 14A to 14G are views each showing an application example of the semiconductor device, which is described in Embodiment 6 of the invention.
Figure 14B:
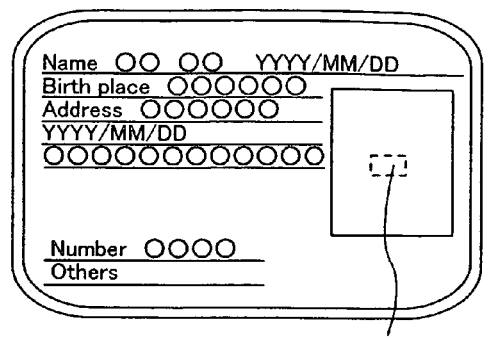
Figure 14C:
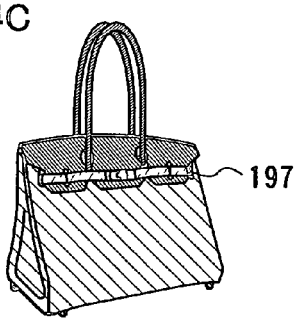
Figure 14D:
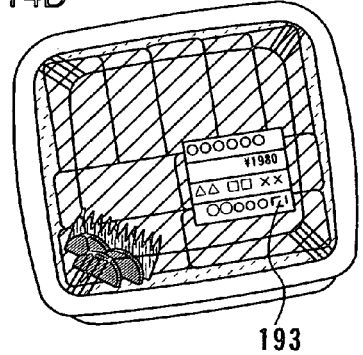
Figure 14E:
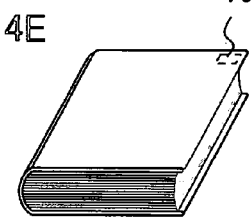
Figure 14F:
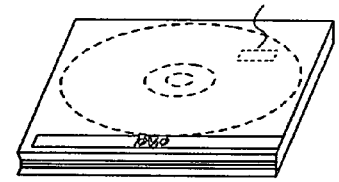
Figure 14G:
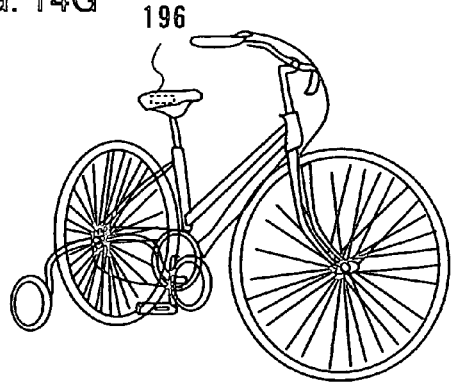

The bills and coins refer to money in the market and include a note that is in currency in a specific area as money (cash voucher), memorial coins, and the like. The securities refer to a check, a certificate, a promissory note, and the like, and can be provided with a processor chip 190 (see FIG. 14A). The certificates refer to a driving license, a resident card, and the like, and can be provided with a processor chip 191 (see FIG. 14B). The vehicles refer to a wheeled vehicle such as a bicycle, a vessel, and the like, and can be provided with a processor chip 196 (see FIG. 14G). The bearer bonds refer to a stamp, a rice coupon, various gift coupons, and the like. The containers for packages refer to paper for wrapping a box lunch or the like, a plastic bottle, and the like, and can be provided with a processor chip 193 (see FIG. 14D). The books refer to a document, a volume, and the like, and can be provided with a processor chip 194 (see FIG. 14E). The recording media refer to DVD software, a video tape, and the like, and can be provided with a processor chip 195 (see FIG. 14F). The personal belongings refer to a bag, glasses, and the like, and can be provided with a processor chip 197 (see FIG. 14C). The foods refer to food items, beverages, and the like. The clothes refer to clothing, footwear, and the like. The healthcare items refer to a medical device, a health appliance, and the like. The commodities refer to furniture, a lighting apparatus, and the like. The medicals refer to a medicine, an agricultural chemical, and the like. The electronic apparatuses refer to a liquid crystal display device, an EL display device, a television set (television receiver, thin television receiver), a cellular phone, and the like.

The semiconductor device of the invention is fixed to a product by being mounted on a printed board, attached to the surface of the product, or embedded in the product. For example, the semiconductor device may be embedded in the paper of a book, or an organic resin of a package. Since the semiconductor device of the invention is small, thin, and lightweight, it can be fixed to a product without detracting from the design of the product itself. In addition, when provided with the semiconductor device of the invention, bills, coins, securities, bearer bonds, certificates, and the like can have an authentication function. The use of the authentication function prevents forgery. When the semiconductor device of the invention is incorporated in containers for packages, recording media, personal belongings, foods, commodities, clothes, electronic apparatuses, and the like, systems such as inspection systems can be performed more efficiently.

Figure 12A:
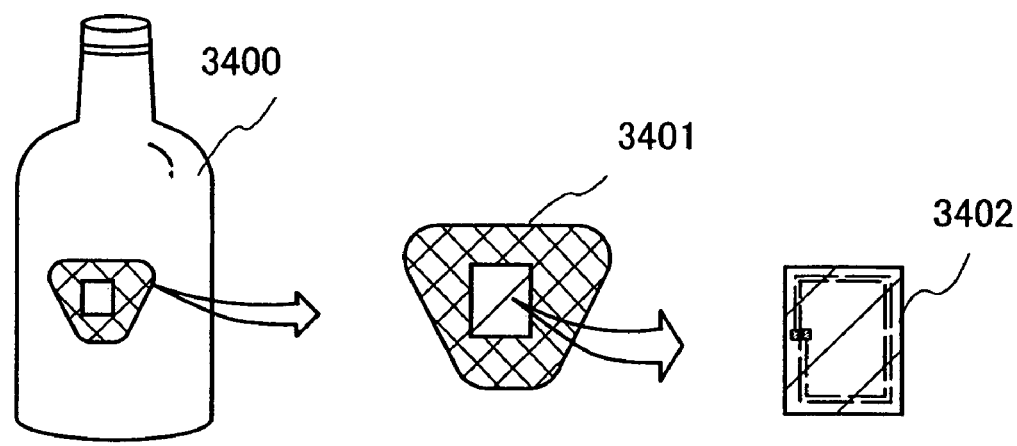
FIGS. 12A and 12B are views each showing an application example of a semiconductor device, which is described in Embodiment 6 of the invention.
Figure 12B:
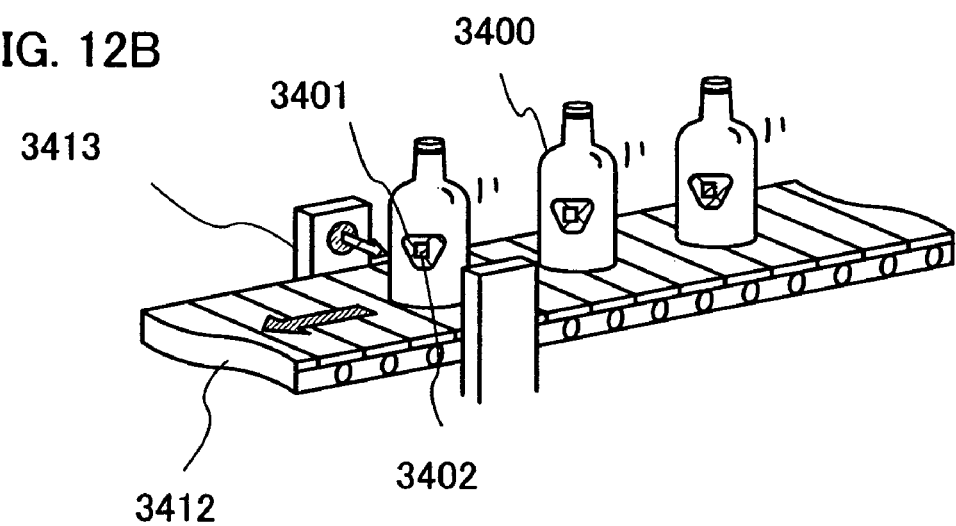

An example of capable of being applied to product management and distribution system is described with reference to FIGS. 12A and 12B. This embodiment shows an example of incorporating a processor chip in a product. As shown in FIG. 12A, a processor chip 3402 is incorporated in a beer bottle 3400 using a label 3401.

The processor chip 3402 stores basic data such as a manufacturing date, a manufacturing area, and ingredients. Such basic data is not required to be rewritten, thus it may be stored in a non-rewritable memory such as a mask ROM and a memory element of the invention. The basic data such as a manufacturing date, a manufacturing area, and ingredients is information that consumers may want to correctly obtain when purchasing a product. When such information is stored in a non-writable memory element, falsification of data and the like can be prevented, and thus accurate information with high reliability can be transmitted to the consumers. The processor chip 3402 also stores individual data such as a delivery address and a delivery date of each beer bottle. For example, as shown in FIG. 12B, when the beer bottle 3400 moving on a conveyor belt 3412 passes a writer device 3413, each delivery address and delivery date can be stored in the processor chip 3402. Such individual data may be stored in a rewritable and erasable memory such as an EEPROM.

A system is preferably configured such that when data on a purchased product is transmitted from a delivery destination to a distribution management center via a network, the delivery address and date are calculated based on the product data by a writer device, a personal computer for controlling the writer device, or the like, and then stored in the processor chip.

Since the bottles are delivered per case, a processor chip may be incorporated in each case or every several cases to store individual data.

When the processor chip is incorporated in such products that may store a plurality of delivery addresses, the time required for manual data input can be reduced, resulting in reduced input errors. In addition, it is possible to lower labor costs that are the most costly expenses in the distribution management. Thus, incorporation of the processor chip allows the distribution management to be performed with few errors at low cost.

Additional data such as food to go with beer and a recipe with beer may be stored at the delivery destination. As a result, the food and the like can be promoted and consumers' willingness to buy can be increased. Such additional data may be stored in a rewritable and erasable memory such as an EEPROM. In this manner, incorporation of the processor chip increases the amount of information given to consumers; thus they can purchase products at ease.

Figure 13B:
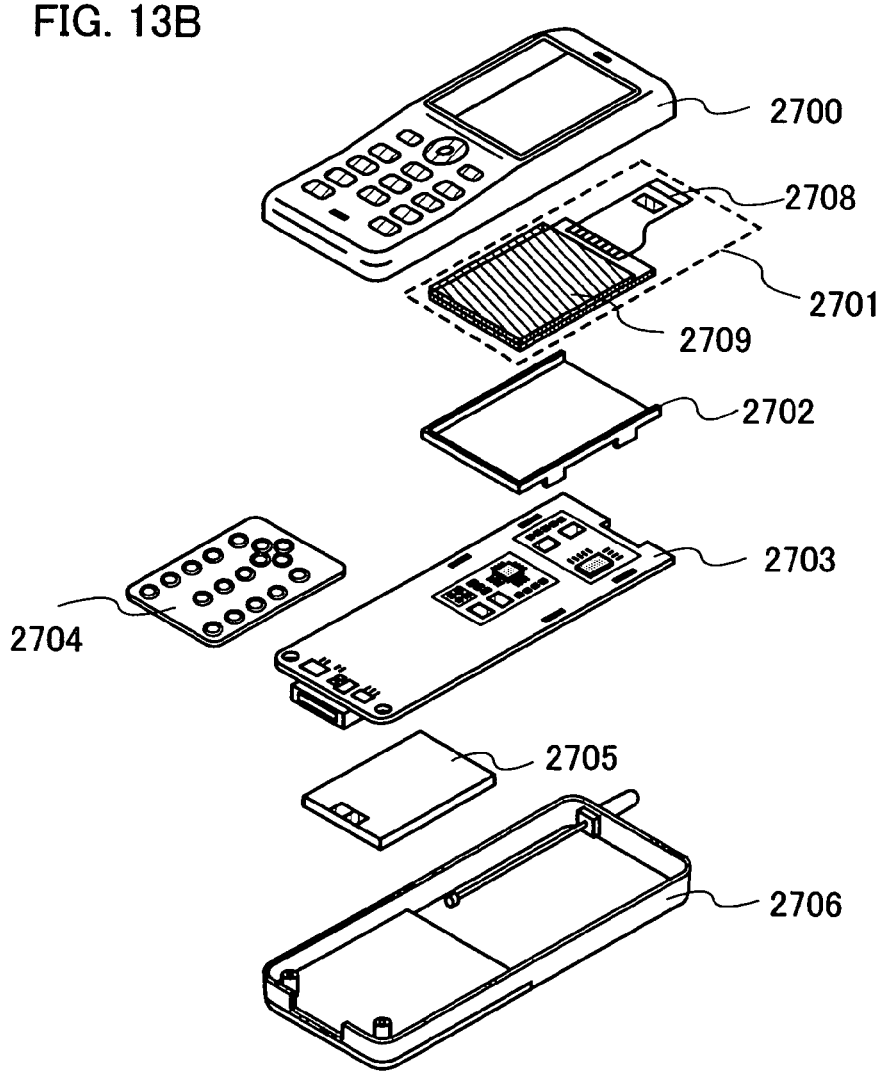

Next, one mode of an electronic apparatus incorporating the semiconductor device of the invention is described with reference to drawings. A cellular phone is shown here as an example of the electronic apparatus, which includes housings 2700 and 2706, a panel 2701, a housing 2702, a printed wiring board 2703, an operating button 2704, and a battery 2705 (see FIG. 13B). The panel 2701 is incorporated in the housing 2702 in a detachable manner and the housing 2702 is fitted into the printed Wiring board 2703. The housing 2702 is appropriately changed in shape and size in accordance with an electronic apparatus where the panel 2701 is incorporated. A plurality of packaged semiconductor devices are mounted on the printed wiring board 2703, one of which can be provided using the semiconductor device of the invention. The plurality of semiconductor devices mounted on the printed wiring board 2703 have any function of a controller, a central processing unit (CPU), a memory, a power supply circuit, an audio processing circuit, a transmitting and receiving circuit, and the like.

The panel 2701 is combined with the printed wiring board 2703 through a connecting film 2708. The panel 2701, the housing 2702, and the printed wiring board 2703 are contained in the housings 2700 and 2706 together with the operating button 2704 and the battery 2705. A pixel area 2709 included in the panel 2701 is arranged so as to be seen from an opening that is provided in the housing 2700.

As set forth above, the semiconductor device of the invention is small, thin, and lightweight, which allows effective utilization of a limited space in the housings 2700 and 2706 of the electronic apparatus.

In addition, since the semiconductor device of the invention has a memory element with a simple structure where an insulating layer is sandwiched between a pair of conductive layers, an electronic apparatus can be provided using an inexpensive semiconductor device. Further, it is easy for the semiconductor device of the invention to be highly integrated, and thus an electronic apparatus can be provided using a semiconductor device having a high capacity memory circuit.

The semiconductor device of the invention has a nonvolatile memory device characterized in that data is written by an optical effect or an electrical effect and data can be additionally written. Such characteristics prevents falsification of data due to rewriting, and allows data to be additionally written. As a result, an electronic apparatus can be provided using a semiconductor device with high performance and high added value.

Note that the housings 2700 and 2706 show examples of appearance of the cellular phone, and electronic apparatuses according to this embodiment may have various modes depending on the function and usage.

This application is based on Japanese Patent Application serial No. 2005-156443 filed in Japan Patent Office on May 27, 2005, the entire contents of which are hereby incorporated by reference.

What is claimed is:

1. A semiconductor device capable of communicating data without contact, comprising:
   an antenna;
   a first insulating layer;
   a first conductive layer over the first insulating layer;
   a second insulating layer over the first conductive layer, the second insulating layer including an opening extending to the first conductive layer;
   a signal wiring layer for electrically connecting an integrated circuit portion to the antenna, the signal wiring layer formed over the second insulating layer; and
   a second conductive layer adjacent to the signal wiring layer, the second conductive layer formed over the second insulating layer,
   wherein the second conductive layer is in contact with the first conductive layer through the opening; and
   wherein the first conductive layer overlaps the signal wiring layer with the second insulating layer interposed therebetween.

2. A semiconductor device capable of communicating data without contact, comprising:
   an antenna;
   a first insulating layer;
   a first conductive layer over the first insulating layer;
   a second insulating layer over the first conductive layer, the second insulating layer including a first opening and a second opening each extending to the first conductive layer;
   a signal wiring layer for electrically connecting an integrated circuit portion to the antenna, the signal wiring layer formed over the second insulating layer;
   a second conductive layer over the second insulating layer; and
   a third conductive layer adjacent to the second conductive layer with the signal wiring layer interposed therebetween, the third conductive layer formed over the second insulating layer,
   wherein the first conductive layer is in contact with the second conductive layer and the third conductive layer through the first opening and the second opening respectively.

3. A semiconductor device capable of communicating data without contact, comprising:
   an antenna;
   a first insulating layer;
   a signal wiring layer for electrically connecting an integrated circuit portion to the antenna, the signal wiring layer formed over the first insulating layer;
   a first conductive layer adjacent to the signal wiring layer, the first conductive layer formed over the first insulating layer;
   a second insulating layer over the signal wiring layer and the first conductive layer, the second insulating layer including an opening extending to the first conductive layer; and
   a second conductive layer over the second insulating layer,
   wherein the second conductive layer is in contact with the first conductive layer through the opening; and
   wherein the second conductive layer overlaps the signal wiring layer with the second insulating layer interposed therebetween.

4. A semiconductor device capable of communicating data without contact, comprising:
   an antenna;
   a first insulating layer;
   a signal wiring layer for electrically connecting an integrated circuit portion to the antenna, the signal wiring layer formed over the first insulating layer;
   a first conductive layer over the first insulating layer;
   a second conductive layer adjacent to the first conductive layer with the signal wiring layer interposed therebetween, the second conductive layer formed over the first insulating layer;
   a second insulating layer over the signal wiring layer, the first conductive layer, and the second conductive layer, the second insulating layer including a first opening extending to the first conductive layer and a second opening extending to the second conductive layer; and
   a third conductive layer over the second insulating layer,
   wherein the third conductive layer is in contact with the first conductive layer and the second conductive layer through the first opening and the second opening respectively.

5. A semiconductor device capable of communicating data without contact, comprising:
   an antenna;
   a first insulating layer;
   a first conductive layer over the first insulating layer;
   a second insulating layer over the first conductive layer, the second insulating layer including a first opening and a second opening;
   a signal wiring layer for electrically connecting an integrated circuit portion to the antenna, the signal wiring layer formed over the second insulating layer;
   a second conductive layer over the second insulating layer;
   a third conductive layer adjacent to the second conductive layer with the signal wiring layer interposed therebetween, the third conductive layer formed over the second insulating layer;

a third insulating layer over the signal wiring layer, the second conductive layer, and the third conductive layer, the third insulating layer including a third opening extending to the second conductive layer and a fourth opening extending to the third conductive layer; and a fourth conductive layer over the third insulating layer, wherein the first conductive layer is in contact with the second conductive layer and the third conductive layer through the first opening and the second opening respectively; and wherein the fourth conductive layer is in contact with the second conductive layer and the third conductive layer through the third opening and the fourth opening respectively.

6. The semiconductor device according to claim 1, wherein the integrated circuit portion comprises a thin film transistor.

7. The semiconductor device according to claim 2, wherein the integrated circuit portion comprises a thin film transistor.

8. The semiconductor device according to claim 3, wherein the integrated circuit portion comprises a thin film transistor.

9. The semiconductor device according to claim 4, wherein the integrated circuit portion comprises a thin film transistor.

10. The semiconductor device according to claim 5, wherein the integrated circuit portion comprises a thin film transistor.

11. The semiconductor device according to claim 1, wherein the integrated circuit portion comprises a memory element.

12. The semiconductor device according to claim 2, wherein the integrated circuit portion comprises a memory element.

13. The semiconductor device according to claim 3, wherein the integrated circuit portion comprises a memory element.

14. The semiconductor device according to claim 4, wherein the integrated circuit portion comprises a memory element.

15. The semiconductor device according to claim 5, wherein the integrated circuit portion comprises a memory element.

16. The semiconductor device according to claim 1, wherein the integrated circuit portion, the signal wiring layer, and the antenna are provided over a flexible substrate.

17. The semiconductor device according to claim 2, wherein the integrated circuit portion, the signal wiring layer, and the antenna are provided over a flexible substrate.

18. The semiconductor device according to claim 3, wherein the integrated circuit portion, the signal wiring layer, and the antenna are provided over a flexible substrate.

19. The semiconductor device according to claim 4, wherein the integrated circuit portion, the signal wiring layer, and the antenna are provided over a flexible substrate.

20. The semiconductor device according to claim 5, wherein the integrated circuit portion, the signal wiring layer, and the antenna are provided over a flexible substrate.

21. A manufacturing method of a semiconductor device capable of communicating data without contact, comprising:
forming an antenna;
forming a first conductive layer over a first insulating layer;
forming a second insulating layer over the first conductive layer;
forming an opening extending to the first conductive layer in the second insulating layer;
forming a conductive film over the second insulating layer and the opening; and
processing the conductive film so as to form a signal wiring layer and a second conductive layer, wherein the signal wiring layer overlaps the first conductive layer with the second insulating layer interposed therebetween and electrically connects an integrated circuit portion to the antenna, and wherein the second conductive layer is adjacent to the signal wiring layer and in contact with the first conductive layer through the opening.

22. A manufacturing method of a semiconductor device capable of communicating data without contact, comprising:
forming an antenna;
forming a first conductive layer over a first insulating layer;
forming a second insulating layer over the first conductive layer;
forming a first opening and a second opening each extending to the first conductive layer in the second insulating layer;
forming a conductive film over the second insulating layer and the first opening and the second opening; and
processing the conductive film so as to form a signal wiring layer and a second conductive layer, wherein the signal wiring layer overlaps the first conductive layer with the second insulating layer interposed therebetween and electrically connects an integrated circuit portion to the antenna, and wherein the second conductive layer is adjacent to the signal wiring layer and in contact with the first conductive layer through the first opening and the second opening.

23. A manufacturing method of a semiconductor device capable of communicating data without contact, comprising:
forming an antenna;
forming a conductive film over a first insulating layer;
processing the conductive film so as to form a signal wiring layer for electrically connecting an integrated circuit portion to the antenna, and a first conductive layer adjacent to the signal wiring layer;
forming a second insulating layer over the signal wiring layer and the first conductive layer;
forming an opening extending to the first conductive layer in the second insulating layer; and
forming a second conductive layer over the second insulating layer and the opening, the second conductive layer being in contact with the first conductive layer through the opening.

24. A manufacturing method of a semiconductor device capable of communicating data without contact, comprising:
forming an antenna;
forming a conductive film over a first insulating layer;
processing the conductive film so as to form a signal wiring layer for electrically connecting an integrated circuit portion to the antenna, and a first conductive layer and a second conductive layer adjacent to each other with the signal wiring layer interposed therebetween;
forming a second insulating layer over the signal wiring layer, the first conductive layer, and the second conductive layer;
forming a first opening extending to the first conductive layer and a second opening extending to the second conductive layer; and
forming a third conductive layer over the second insulating layer, the first opening, and the second opening, the third conductive layer being in contact with the first conductive layer and the second conductive layer through the first opening and the second opening respectively.

25. A manufacturing method of a semiconductor device capable of communicating data without contact, comprising:
forming an antenna;

forming a first conductive layer over a first insulating layer;

forming a second insulating layer over the first conductive layer;

forming a first opening and a second opening in the second insulating layer;

forming a conductive layer over the second insulating layer and the first opening and the second opening;

processing the conductive layer so as to form a signal wiring layer for electrically connecting an integrated circuit portion to the antenna, and a second conductive layer and a third conductive layer that are adjacent to each other with the signal wiring layer interposed therebetween and in contact with the first conductive layer through the first opening and the second opening respectively;

forming a third insulating layer over the signal wiring layer, the second conductive layer, and the third conductive layer;

forming a third opening extending to the second conductive layer and a fourth opening extending to the third conductive layer in the third insulating layer; and forming a fourth conductive layer over the third insulating layer and the third opening and the fourth opening, the fourth conductive layer being in contact with the second conductive layer and the third conductive layer through the third opening and the fourth opening respectively.

26. The manufacturing method of a semiconductor device, according to claim 21, wherein a thin film transistor is formed in the integrated circuit portion.

27. The manufacturing method of a semiconductor device, according to claim 22, wherein a thin film transistor is formed in the integrated circuit portion.

28. The manufacturing method of a semiconductor device, according to claim 23, wherein a thin film transistor is formed in the integrated circuit portion.

29. The manufacturing method of a semiconductor device, according to claim 24, wherein a thin film transistor is formed in the integrated circuit portion.

30. The manufacturing method of a semiconductor device, according to claim 25, wherein a thin film transistor is formed in the integrated circuit portion.

31. The manufacturing method of a semiconductor device, according to claim 21, wherein a memory element is formed in the integrated circuit portion.

32. The manufacturing method of a semiconductor device, according to claim 22, wherein a memory element is formed in the integrated circuit portion.

33. The manufacturing method of a semiconductor device, according to claim 23, wherein a memory element is formed in the integrated circuit portion.

34. The manufacturing method of a semiconductor device, according to claim 24, wherein a memory element is formed in the integrated circuit portion.

35. The manufacturing method of a semiconductor device, according to claim 25, wherein a memory element is formed in the integrated circuit portion.

36. The manufacturing method of a semiconductor device, according to claim 21, wherein the integrated circuit portion, the signal wiring layer, and the antenna are formed over a flexible substrate.

37. The manufacturing method of a semiconductor device, according to claim 22, wherein the integrated circuit portion, the signal wiring layer, and the antenna are formed over a flexible substrate.

38. The manufacturing method of a semiconductor device, according to claim 23, wherein the integrated circuit portion, the signal wiring layer, and the antenna are formed over a flexible substrate.

39. The manufacturing method of a semiconductor device, according to claim 24, wherein the integrated circuit portion, the signal wiring layer, and the antenna are formed over a flexible substrate.

40. The manufacturing method of a semiconductor device, according to claim 25, wherein the integrated circuit portion, the signal wiring layer, and the antenna are formed over a flexible substrate.

* * * * *

UNITED STATES PATENT AND TRADEMARK OFFICE
CERTIFICATE OF CORRECTION

| | |
|---|---|
| PATENT NO. | : 7,566,971 B2 |
| APPLICATION NO. | : 11/417187 |
| DATED | : July 28, 2009 |
| INVENTOR(S) | : Takanori Matsuzaki et al. |

It is certified that error appears in the above-identified patent and that said Letters Patent is hereby corrected as shown below:

At column 18, line 17, please replace "Ar" with --As--.

Signed and Sealed this

Fifth Day of January, 2010

David J. Kappos
*Director of the United States Patent and Trademark Office*